(12) United States Patent  
Suhara et al.

(10) Patent No.: US 6,688,016 B2
(45) Date of Patent: Feb. 10, 2004

(54) ANGULAR POSITION ADJUSTING DEVICE

(75) Inventors: Shinsuke Suhara, Kariya (JP); Akiyoshi Tanaka, Aichi-ken (JP); Takayuki Mizuno, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 11 days.

(21) Appl. No.: 10/108,633

(22) Filed: Mar. 29, 2002

(65) Prior Publication Data

US 2002/0144422 A1 Oct. 10, 2002

(30) Foreign Application Priority Data

Apr. 5, 2001 (JP) .......................................... 2001-107243

(51) Int. Cl.$^7$ ............................................... G01D 21/00
(52) U.S. Cl. .......................... 033/613; 33/1 PT; 33/618; 33/626; 33/645; 33/832; 33/833; 33/642; 33/1 M; 269/153
(58) Field of Search .......................... 33/613, 618, 626, 33/645, 1 PT, 832, 833, 642, 1 M; 269/153

(56) References Cited

U.S. PATENT DOCUMENTS

| 4,328,621 | A | * | 5/1982 | Benjamin | 33/613 |
| 4,425,076 | A | * | 1/1984 | Colineau | 269/153 |
| 4,805,316 | A | * | 2/1989 | Curti | 33/613 |
| 4,936,023 | A | * | 6/1990 | Pechak | 33/613 |
| 4,972,599 | A | * | 11/1990 | Ernst | 33/1 PT |
| 6,058,835 | A | * | 5/2000 | Isogai et al. | 101/127.1 |
| 6,085,432 | A | * | 7/2000 | Van der Sluis et al. | 33/613 |
| 6,360,449 | B1 | * | 3/2002 | Steentjes | 33/613 |
| 6,427,352 | B1 | * | 8/2002 | Pfeiffer et al. | 33/613 |
| 6,442,857 | B1 | * | 9/2002 | Atsuhiko et al. | 33/1 M |
| 2002/0112357 | A1 | * | 8/2002 | Lahr | |
| 2002/0189340 | A1 | * | 12/2002 | Roberge et al. | |

FOREIGN PATENT DOCUMENTS

JP          8-242094 A          9/1996

OTHER PUBLICATIONS

Roberge et al., US Patent Application Publication No. US 2002/0189340, Dec. 19, 2002.*
Lahr, US Patent Application Publication No. US 2002/0112357, Aug. 22, 2002.*

* cited by examiner

Primary Examiner—Christopher W. Fulton
Assistant Examiner—Amanda J Hoolahan
(74) Attorney, Agent, or Firm—Oliff & Berridge, PLC

(57) ABSTRACT

An angular position adjusting device including a first member which holds an object having an axis of rotation, a second member which holds the first member rotatably about the axis of the object, and a rotating mechanism interposed between the first and second members and operable to rotate the first member relative to the second member about the axis of the object, and wherein one of the first and second members has an guiding surface formed to extend along an arc of a circle having a center at the axis of the object, the arc having a center angle smaller than 180°, and the other of the first and second members has a guided surface for sliding contact with the arcuate guiding surface, when the first member is rotated by the rotating mechanism relative to the second member, to adjust the angular position of the object about its axis.

18 Claims, 7 Drawing Sheets

ANGULAR POSITION ADJUSTING DEVICE

This application is based on Japanese Patent Application No. 2001-107243 filed on Apr. 5, 2001, the contents of which are incorporated hereinto by reference.

BACKGROUND OF THE INVENTION

1. Field of the Invention

The present invention relates in general to a device for adjusting an angular position of an object about an axis or centerline of the object, and more particularly to reduction in size of the device.

2. Discussion of Related Art

For example, an angular position adjusting device is provided in an electric-component mounting device, and is used to adjust the angular position of an image-taking device. The image-taking device is used, for instance, to take an image of an electric component as held by a component holding device, for detecting positioning errors of the electric component as held by the component holding device, on the basis of image data indicative of the image of the electric component. The image-taking device is rotated about its axis or centerline, by the angular position adjusting device, so that an imaging area on which the image is formed is rotated about the axis of the image-taking device. The imaging area is perpendicular to the axis and has a center on the axis. By rotating the image-taking device, the angular position of the imaging area about its axis can be adjusted as desired, in order to prevent a detecting error of the positioning errors of the electric component on the basis of the image data, which detecting error takes place due to an angular positioning error of the imaging area of the image-taking device.

A known angular position adjusting device to adjust the angular position of the image-taking device includes a fitting portion formed on a first bracket holding the image-taking device, and has a fitting hole formed in a second bracket which holds the first bracket. The fitting portion has a circular cross sectional shape, and is coaxial with the axis of the image-taking device, having a diameter larger than that of the image-taking device. The fitting hole also has a circular cross sectional shape, and the fitting portion is slidably fitted in and guided by the fitting hole at an outer circumferential surface of the fitting portion and an inner circumferential surface of the fitting hole. The angular position adjusting device includes a rotating device operable to rotate the first bracket relative to the second bracket about the axis of the image-taking device, for thereby rotating the image-taking device about axis, so as to adjust the angular position of the image-taking device. Thus, the angular position adjusting device uses the fitting portion and the fitting hole which engage each other such that the fitting portion and hole are rotatable relative to each other.

The known angular position adjusting device is associated with the entire circumference of the image-taking device, and therefore tends to be relatively large-sized, requiring a comparatively large space for installation of the image-taking device. Accordingly, the known angular position adjusting device lowers the freedom of designing of component members surrounding the image-taking device, and may make it difficult to suitably install the image-taking device.

While the angular position adjusting device as applied to the image-taking device used in an electric-component mounting system has the above-indicated drawback, a similar drawback is encountered where the angular position adjusting device is used for an image-taking device in other systems, and for adjusting the angular position of any object other than the image-taking device, which objects has an axis or centerline.

SUMMARY OF THE INVENTION

It is therefore an object of the present invention to reduce the size of an angular position adjusting device. This above object may be achieved according to any one of the following modes of the present invention in the form of an angular position adjusting device, a position adjusting device, and an electric-component mounting system. Each of the following modes of the invention is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) An angular position adjusting device for adjusting an angular position of an object about an axis of rotation of the object, the angular position adjusting device comprising:

a first member which holds the object;

a second member which holds the first member such that the first member is rotatable about the axis of the object; and a rotating mechanism interposed between the first and second members, and operable to rotate the first member relative to the second member about the axis, and wherein the second member has an arcuate guiding surface formed to extend along an arc of a circle having a center at the axis of rotation of the object, the arc having a center angle smaller than 180°, and the first member has a guided surface for sliding contact with the arcuate guiding surface to guide a rotary movement of the first member by the rotating mechanism relative to the second member, for rotating the object about the axis.

Each of the guiding and guided surfaces may be a part-cylindrical surface having a predetermined radius of curvature (a predetermined distance from the axis of rotation of the object), an inclined surface whose radius of curvature continuously changes in the axial direction of the object, or a stepped part-cylindrical surface having two or more radii of curvature.

When the first member is rotated by the rotating mechanism about the axis of the object, to adjust the angular position of the object, the guided surface is guided by the guiding surface so that the object is rotated about its axis. The center angle of the arc of the arcuate guiding and guided surfaces is smaller than 180° of the circle having its center at the axis of rotation of the object. Accordingly, the angular position adjusting device is disposed along only a part of the periphery of the object and can be made comparatively compact, so that the required space for installing the object together with the angular position adjusting device can be reduced, leading to an increased freedom of designing of the component members surrounding the object and simplification of a device or system provided with the object, or making it possible to provide a compact device or system with the object such that the angular position of the object is adjustable.

Further, the angular position of the object can be adjusted by rotating the object about its axis, without a deviation of the axis from the nominal position. Thus, the angular position can be adjusted with high efficiency, without calculating an amount of such a deviation and re-establishing the nominal position of the axis of the object.

Since the angular position adjusting device can be made compact as described above, the sizes of the workpieces to be machined to manufacture the angular position adjusting device can be made accordingly small, and the required time of machining the workpieces can be shortened.

(2) The angular position adjusting device according to the above mode (1), further comprising a biasing device interposed between the first and second members and operable to bias the first and second members toward each other, for pressing contact of the guiding and guided surfaces with each other.

Since the guiding and guided surfaces are held in pressing contact with each other, the axis of rotation of the object is not moved in a plane perpendicular to the axis, when the first member is rotated relative to the second member. Accordingly, the angular position of the object can be adjusted with a high degree of accuracy.

(3) The angular position adjusting device according to the above mode (1) or (2), wherein the guiding surface formed on the second member is a part-cylindrical concave surface while the guided surface formed on the first member is a part-cylindrical convex surface.

The part-cylindrical concave surface and the part-cylindrical convex surface may be respectively one of opposite part-cylindrical surfaces of an arcuate groove, and one of opposite part-cylindrical surfaces of an arcuate protrusion. Alternatively, the part-cylindrical concave and convex surfaces may be stepped part-cylindrical cylindrical surfaces.

(4) The angular position adjusting device according to the above mode (2) or (3), wherein the biasing device includes:
  a ball;
  a ball holder holding the ball such that the ball can roll and partly project from the ball holder but cannot be removed from the ball holder; and
  an elastic member interposed between the ball and the ball holder and biasing the ball in a direction for the ball to project from the ball holder,
  and wherein the ball holder is fixed to one of the first and second members, such that the ball is held in pressing contact with a part-cylindrical surface which is formed on the other of the first and second members, so as to extend along an arc of the above-indicated circle having the center at the axis of rotation of the object.

When the first member is rotated, the biasing device is moved relative to the other of the first and second members, while biasing the first and second members toward each other in a direction substantially parallel to the radial direction of the object. The ball is held in pressing contact with the part-cylindrical surface of the above-indicated other member, and is moved in rolling contact with this part-cylindrical surface when the first member is rotated. The rolling contact of the biasing device at its ball with the part-cylindrical surface is effective to reduce an amount of wear of the part-cylindrical surface, resulting in a prolonged life of the angular position adjusting device.

(5) The angular position adjusting device according to the above mode (2), wherein one of the first and second members has an arcuate groove having a substantially rectangular shape in cross section taken in a plane which is parallel to a radial direction of the object and which includes the axis of rotation of the object, and the other of the first and second members includes an arcuate protrusion received in the arcuate groove, and wherein one of opposite arcuate surfaces of the arcuate groove and one of arcuate opposite surfaces of the arcuate protrusion which is opposed to the above-indicated one of the opposite arcuate surfaces of the arcuate groove are forced against each other with a biasing force of by the biasing device and serve as one and the other of the guiding surface and the guided surface.

In the angular position adjusting device according to the above mode (5), portions of the guided and guiding surfaces which receive the biasing force of the biasing device are located in a plane perpendicular to the axis of rotation of the object, so that the guided and guiding surfaces are held in pressing contact with each other, without the biasing force of the biasing device causing a moment to rotate the first member about an axis perpendicular to the axis of rotation of the object. The first and second members may receive the biasing force at different positions which are spaced apart from each other in a direction parallel to the axis of rotation of the object, where suitable means is provided to prevent an inclination of the first member which would take place due to generation of the above-indicated moment. However, the provision of such means to prevent the inclination of the first member causes drawbacks such as an increase in the cost of manufacture of the angular position adjusting device. In the angular position adjusting device according to the above mode (5), the angular position of the object can be adjusted while the guiding and guided surfaces are kept in pressing contact with each other, without an inclination of the first member, so that the size of the angular position adjusting device can be reduced, without an unnecessary increase in the cost of manufacture.

Where the width of the arcuate protrusion is made smaller than that of the arcuate groove, a gap may be provided between the other of the above-indicated opposed surfaces of the arcuate protrusion and the other of the above-indicated opposed surfaces of the arcuate groove, so that the first member can be smoothly rotated with a reduced resistance of friction between the first and second members, while the guiding and guided surfaces are held in pressing close contact with each other.

(6) The angular position adjusting device according to the above mode (5), wherein the biasing device includes:
  a ball;
  a ball holder holding the ball such that the ball can roll and can partly project from the ball holder but cannot be removed from the ball holder; and
  an elastic member interposed between the ball and the ball holder and biasing the ball in a direction for the ball to project from the ball holder,
  and wherein the ball holder is fixed to one of the arcuate protrusion and a portion of the above-indicated one of the first and second members which portion has the other of the opposite arcuate surfaces of the arcuate groove, the ball holder being fixed so as to extend in a substantially radial direction of the arcuate protrusion and groove, and wherein the ball is held in pressing contact with one of the other of the opposite arcuate surfaces of the arcuate protrusion and the other of the opposite arcuate surfaces of the arcuate groove.

The ball is held in pressing contact with at least one of the arcuate surface of the arcuate protrusion which is not the guiding or guided surface, and the arcuate surface of the arcuate groove which is not the guiding or guided surface. Since the ball holder is fixed so as to extend in the substantially radial direction of the arcuate protrusion and groove, the ball is pressed against the appropriate arcuate surface in a direction normal to this arcuate surface, so that the biasing force of the elastic member is effectively applied to the arcuate surface.

(7) The angular position adjusting device according to the above mode (6), wherein the ball is held in pressing contact with the other of the opposite arcuate surfaces of the arcuate protrusion, and this other arcuate surface of the arcuate protrusion is inclined such that a distance between the opposite arcuate surfaces of the arcuate protrusion decreases in a direction from a free end toward a fixed end of the arcuate protrusion.

The inclination of the arcuate surface of the arcuate protrusion causes a force to act on the first member in the axial direction of the object such that the first member is moved toward the second member, so that the first and second members are forced against each other in the axial direction of the object. Thus, the inclination of the arcuate surface of the arcuate protrusion prevents a movement of the first member away from the second member in the axial direction, so that the first member can be rotated relative to the second member with high stability.

The technical feature according to the above mode (7) is applicable to the angular position adjusting device according to the above mode (4).

(8) The angular position adjusting device according to the above mode (6), wherein the ball is held in pressing contact with the other of the opposite arcuate surfaces of the arcuate groove, and this other arcuate surface of the arcaute groove is inclined such that a distance between the opposite arcuate surfaces of the arcuate groove decreases in a direction from a bottom toward an opening of the arcuate groove.

The angular position adjusting device according to the above mode (8) has the same advantage as described above with respect to the above mode (7). The technical feature according to the above mode (8) is also applicable to the angular position adjusting device according to the above mode (4).

(9) The angular position adjusting device according to any one of the above modes (1)–(8), wherein the first and second members have respective contacting surfaces which are held in contact with each other in an axial direction of the object, for positioning the first and second members in the axial direction.

(10) The angular position adjusting device according to the above mode (9), further comprising a tightening device operable to force the first and second members against each other ins the axial direction for increasing a pressure of contact of the contacting surfaces.

(11) The angular position adjusting device according to any one of the above modes (1)–(10), wherein the first and second member and the rotating mechanism are provided for each of a plurality of objects which are arranged such that axes of rotation of the objects extend in parallel with each other in a plane and are spaced apart from each other at a predetermined spacing pitch in a direction parallel to the above-indicated plane and perpendicular to the axes, the first members for the plurality of objects being arranged in the direction parallel to the above plane and perpendicular to the axes of the object, while the second members for the plurality of objects being similarly arranged in the direction parallel to the above plane and perpendicular to the axes.

The first members corresponding to the plurality of objects are disposed so as to extend in a direction perpendicular to the plane in which the axes of the objects lie. Similarly, the second members corresponding to the objects are disposed so as to extend in the above-indicated direction.

Accordingly, a plurality of sets of the object, first member and second member may be arranged adjacent to each other without a gap or with only a small amount of gap, in the direction which is parallel to the plane including the axes of the object and which is perpendicular to the axes. Therefore, a system including the plurality of objects and the angular position adjusting device can be made compact.

(12) The angular position adjusting device according to any one of the above modes (1)–(11), wherein the object is an image-taking device.

(13) A position adjusting apparatus comprising:
an angular position adjusting device as defined in any one of the above modes (1)–(12); and
at least one of (a) a first-direction position adjusting device operable to adjust a position of the object in a first direction parallel to an axial direction of the object, (b) a second-direction position adjusting device operable to adjust a position of the object in a second direction which is parallel to one of two mutually perpendicular directions which are perpendicular to the first direction; and (c) a third-direction position adjusting device operable to adjust a position of the object in a third direction which is parallel to the other of the two mutually perpendicular directions.

(14) An electric-component mounting system comprising:
a substrate holding device operable to hold a circuit substrate;
a component supplying device operable to supply an electric component;
a component mounting device including a suction nozzle to hold the electric component by suction under a negative pressure, the component mounting device being operable to receive at the suction nozzle the electric component from the component supplying device, and to mount the electric component on the circuit substrate held by the substrate holding device;
an image-taking device operable to take an image of the electric component as held by the suction nozzle;
a first member which holds the image-taking device;
a second member which holds the first member such that the first member is rotatable about an axis of the image-taking device; and
a rotating mechanism interposed between the first and second members, and operable to rotate the first member relative to the second member about the axis,
and wherein the second member has an arcuate guiding surface formed to extend along an arc of a circle having a center at the axis of the object, the arc having a center angle smaller than 180°, and the first member has a guided surface for sliding contact with the arcuate guiding surface to guide a rotary movement of the first member by the rotating mechanism relative to the second member, for rotating the object about the axis of the image-taking device.

For instance, the circuit substrate may be selected from among: a printed-wiring board on which electric components (e.g., electronic components) have been mounted for none of printed wirings formed on an electrically insulating substrate; a printed-wiring board on which electric components have been mounted for some of the printed wirings: a printed-wiring board on which electric components have been mounted and soldered to the printed wirings; a circuit board on which small electric components are to be mounted; and a substrate on which are formed solder bumps for package electric components in which chips are enclosed in protective housings.

The component mounting device may include a component holding device, which includes the suction nozzle, or the suction nozzle and a nozzle holder holding the suction nozzle.

For instance, the component mounting device may be one of the following three types: (a) a device including a plurality of component holding devices, and a moving device in the form of a turning device operable to turn the plurality of component holding devices about a common axis of turning such that each of the component holding device is sequentially stopped at a plurality of working positions arranged along a circle having a center at the common axis of turning, so that the component holding device located at one of the working positions receives the electric component from the component supplying device, while the component holding device located another of the working positions transfers the electric component onto the circuit substrate; (b) a device including a component holding device movable in a plane parallel to the component mounting surface of the printed board, in two mutually perpendicular directions, and a moving device operable to move the component holding device in the above-indicated plane, to desired positions at which the component holding device receives the electric components from the component supplying device, so that the electric component is transferred from the component holding device onto the circuit substrate; and (c) a device including a component holding device movable in a plane parallel to the component mounting surface of the printed board, in one of two mutually perpendicular directions, and a moving device operable to move the component holding device in the above-indicated one direction, to receive the electric components from the component supplying device and mount the electric components onto the circuit substrate.

In the electric-component mounting system including the component mounting device of the type (a), the turning device may include a rotary body rotatable about an axis, and a rotating device operable to rotate the rotary body in a selected one of opposite directions by a desired angle. The rotary body carries the plurality of component holding devices, and is rotated to move each component holding device sequentially to the component-receiving position and the component-mounting position. The rotary body may be an rotated indexing body which is intermittently rotated by an intermittently rotating device and which carries the component holding devices such that the component holding devices are equiangularly spaced apart from each other in the rotating direction of the indexing body. In this case, each component holding device is sequentially stopped at the component-receiving and component-mounting positions by intermittent rotary motions of the indexing body. Alternatively, the turning device may include a plurality of rotary members arranged about a common axis of turning such that the rotary members can be turned about the common axis of turning, and a turning-motion applying device including a cam device operable to turn the rotary members about the common axis, at a speed controlled in a predetermined pattern, so that each rotary member is sequentially stopped at a plurality of working stations at different times. The rotary members carry the respective component holding devices such that each component holding device is rotatable about its axis and is axially movable relative to the rotary members, so that the component holding devices can be turned with the rotary members about the common axis of turning.

In the electric-component mounting system including the component mounting device of the type (a), the substrate supporting device includes a substrate supporting unit for supporting the circuit substrate, and a substrate moving device operable to move the substrate supporting unit in the plane parallel to the circuit substrate, in the two mutually perpendicular directions, while the component supplying device includes the two component supply tables, and a table moving device operable to move the component supply tables in a direction in which the component-supply portions of the plurality of component feeders of each table are arranged. In the component mounting system including the component mounting device of the type (b), the substrate supporting device and the component supply tables are fixedly disposed. In the component mounting system including the component mounting device of the type (c), the substrate supporting device includes a substrate supporting unit for supporting the circuit substrate, and a substrate moving device operable to move the circuit substrate supporting unit in the plane parallel to the circuit substrate, in one of the two mutually perpendicular directions in which the component holding device is not movable. In this third case, the component supply tables may be fixedly disposed such that the component holding device is movable to each of the component-supply portions of the component feeders. Alternatively, the component supply tables may be movable in the direction in which the component-supply portions of the component feeders are arranged. The component-supply portions of the component feeders may be arranged along a straight line, a curved line, a circular arc, or a line consisting of any combination of those lines and arc.

Where the component holding device is movable by the moving device in the plane parallel to the circuit substrate or along a straight line in this plane, another moving device may be provided to give the component holding device a supplemental or auxiliary motion. Where a plurality of component holding devices are carried by a rotary body (e.g., intermittently rotated indexing body), for instance, this rotary body may be arranged to be linearly movable by another moving device in two mutually perpendicular directions in the above-indicated plane, so that each component holding head is moved to a desired component mounting spot on the circuit substrate, by a combination of the rotary and linear motions of the rotary body. In this case, the axis of rotation of the rotary body may be either perpendicular or inclined to the plane in which the component holding devices are linear moved. The working position at which each component holding device carried by the rotary body receives the electric component from the component supplying device may be the same as or different from the working position at which each component holding device transfers the electric component onto the printed board.

The electric-component mounting system according to the above mode (14) can be made compact in construction, while permitting an adjustment of the angular position of the image-taking device.

(15) The electric-component mounting system according to the above mode (14), wherein a plurality of sets of the image-taking device, the first and second members and the rotating mechanism are arranged such that the axes of the image-taking devices extend in parallel with each other in a plane and are spaced apart from each other at a predetermined spacing pitch in a direction parallel to the above-indicated plane and perpendicular to the axes of the image-taking devices.

The electronic-component mounting system according to the above mode (15) can be made compact in construction, while permitting adjustments of the angular positions of the individual image-taking devices.

(16) The electronic-component mounting system according to the above mode (15), further comprising an optical guiding device including a light-receiving portion disposed so as to be in opposed relation with the suction nozzle, and a light-distributing portion arranged to distribute a light received by the light-receiving portion, to the plurality of image-taking devices.

(17) The electronic-component mounting system according to any one of the above modes (14)–(16), further comprising at least one of (a) a first-direction position adjusting device operable to adjust a position of the object in a first direction parallel to an axial direction of the object, (b) a second-direction position adjusting device operable to adjust a position of the object in a second direction which is parallel to one of two mutually perpendicular directions which are perpendicular to the first direction; and (c) a third-direction position adjusting device operable to adjust a position of the object in a third direction which is parallel to the other of the two mutually perpendicular directions.

BRIEF DESCRIPTION OF THE DRAWINGS

The above and other objects, features, advantages and technical and industrial significance of the present invention will be better understood by reading the following detailed description of a presently preferred embodiment of the invention, when considered in connection with the accompanying drawings, in which.

DETAILED DESCRIPTION OF THE PREFERRED EMBODIMENTS

Figure 1:
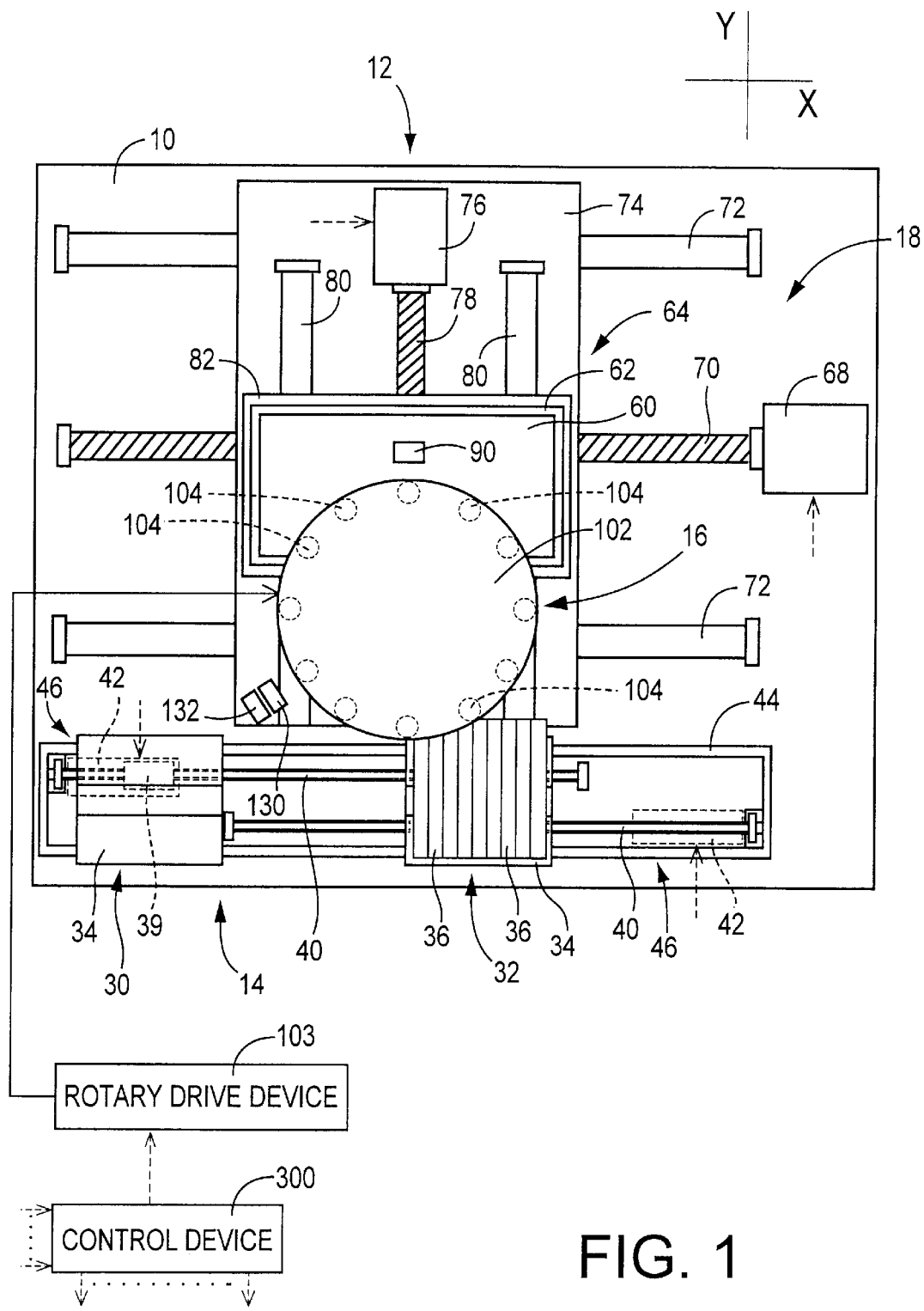
FIG. 1 is a plan view schematically showing an electronic-component mounting system incorporating angular position adjusting devices constructed according to one embodiment of this invention.

Referring first to FIG. 1, reference numeral 10 denotes a machine base of an electric-component mounting system in the form of an electronic-component mounting system 12. The electronic-component mounting device 12 includes a component supply device 14, a component mounting device 16, and a circuit-substrate supporting device in the form of a printed-wiring board supporting device 18 (hereinafter abbreviated as "PWB supporting device 18"), which are mounted on the machine base 10.

The component supply device 14 includes two component supply tables 30, 32. However, only one of these two component supply tables may be provided. Each of the two component supply tables 30, 32 includes a feeder support structure in the form of a feeder carriage 34, and a plurality of tape feeders 36 mounted on the feeder carriage 34.

Figure 2:
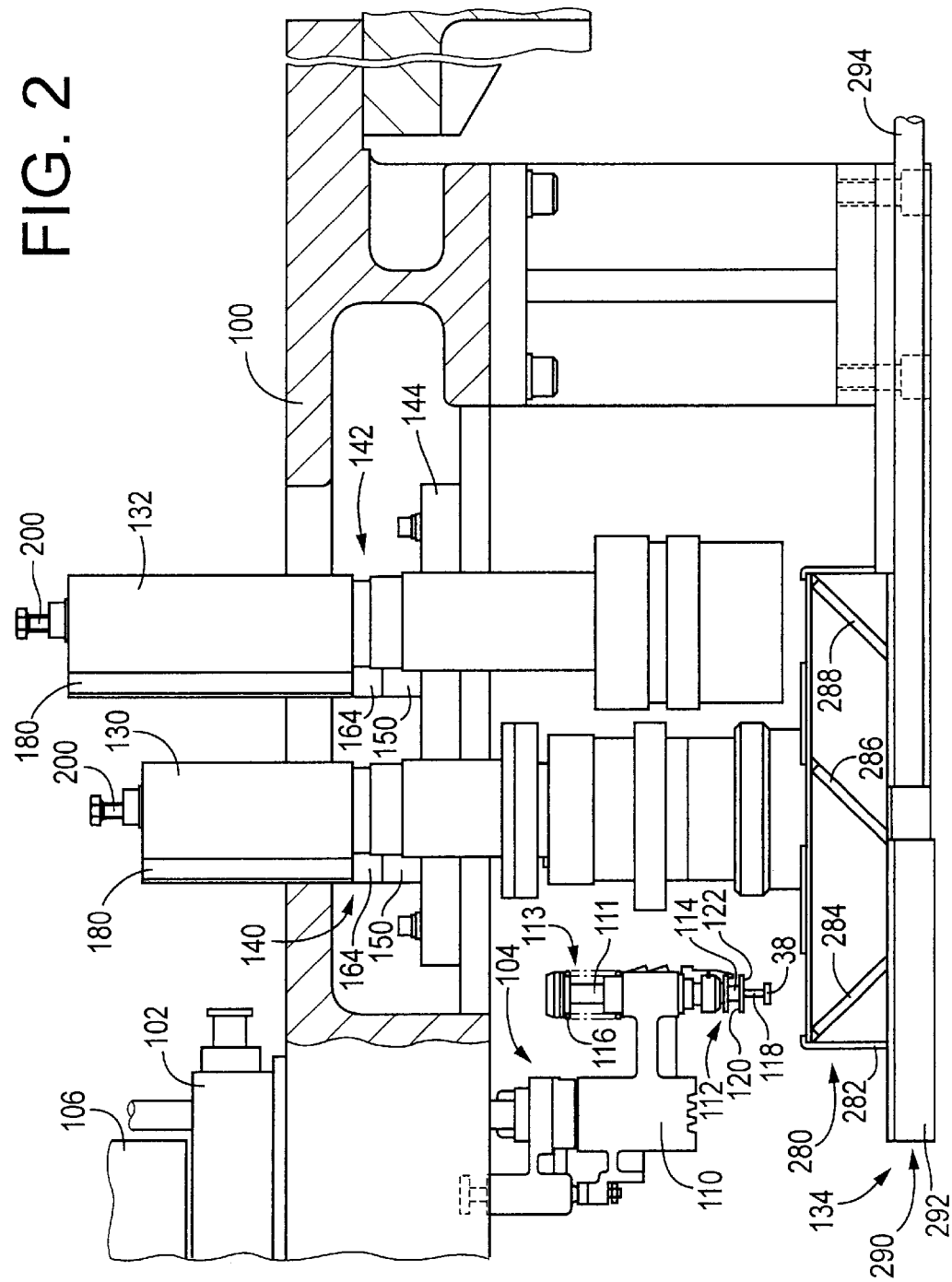
FIG. 2 is a front elevational view partly in cross section showing a suction nozzle of a component mounting device together with two component cameras, which are used in the electronic-component mounting system.

Each tape feeder 36 is arranged to feed a carrier tape 22 which accommodates electric components in the form of electronic components 38 (FIG. 2). The carrier tape 22 includes a carrier substrate (not shown) which has a multiplicity of component-accommodating recesses formed at a suitable interval along the length of the tape. The electronic components 38 are accommodated in the respective component-accommodating recesses, and the opening of each recess is closed by a covering tape bonded to the carrier substrate. The carrier tape 22 is fed by a tape feeding device while the covering tape is removed from the carrier substrate, so that the electronic components 38 are successively fed to a predetermined position at a component-supply portion of the tape feeder 36. The plurality of tape feeders 36 are removably mounted on the feeder carriage 34 such that the component-supply portions of the tape feeders 36 are arranged along a straight line, namely, a horizontal straight line. The direction in which the component-supply portions of the tape feeders 36 are arranged on the feeder carriage 34 is referred to as an X-axis direction (right and left direction as seen in FIG. 1).

The feeder carriage 34 of each component supply table 30, 32 has a ballnut 39 fixed thereto. The ballnut 39 is held in engagement with a feed screw in the form of a ballscrew 40, which is rotated by a carriage drive motor 42, so that each component supply table 30, 32 is moved in the X-axis direction while being guided by a guiding device including a guide rail 44. Thus, the component-supply portion of the plurality of tape feeders 36 are selectively brought into a predetermined component-supply position at which the electronic components 38 are supplied. The ballscrew 40 and the carriage drive motor 42 constitute a major portion of a table positioning device 46 operable to move each component supply table 30, 32. The two component supply tables 30, 32 are respectively moved by two table positioning devices 46. The guide rail 44 is used commonly for the two component supply tables 30, 32. The electric components 38 are supplied from the two component supply tables 30, 32 in a manner well known in the art, for instance, in a manner as disclosed in JP-B2-8-21791. In FIG. 1, the nut 39 of the component supply table 30 is shown, but the tape feeders 36 mounted on the table 30 are not shown, while the tape feeders 36 of the component supply table 32 are shown, but the nut 39 of the table 32 is not shown.

The PWB supporting device 18 includes a substrate supporting unit in the form of a printed-wiring-board supporting unit 62 (hereinafter abbreviated as "PWB supporting unit") arranged to support a circuit substrate in the form of a printed-wiring board 60, and a supporting-unit moving device 64 arranged to move the PWB supporting unit 62 for thereby moving the printed-wiring board 60.

The supporting-unit moving device 64 includes an X-axis slide 74, and a Y-axis slide 82 mounted on the X-axis slide 74. The X-axis slide 74 includes is moved in the X-axis direction by an X-axis drive motor 68 and a feedscrew in the form of a ballscrew 70, while being guided by a guide rail 72. The Y-axis slide 82 is moved in a Y-axis direction by a Y-axis drive motor 76 and a feedscrew in the form of a ballscrew 78, while being guided by a guide rail 80.

The Y-axis slide 82 is arranged to support the PWB supporting unit 62, which in turn is arranged to support the printed-wiring board 60 such that the board 60 maintains a horizontal attitude. The Y-axis direction is perpendicular to the above-indicated X-axis direction, and cooperates with the X-axis direction to define a horizontal plane parallel to the surface of the printed-wiring board 60. The PWB supporting unit 62 is mounted on the Y-axis slide 82 such that the PWB supporting unit 62 is movable in a Z-axis direction perpendicular to the X-axis and Y-axis directions, that is, in the vertical direction. The PWB supporting unit 62 is movable by an elevator device (not shown) in the Z-axis direction between a board-loading/unloading position and a component-mounting position which is located below the board-loading/unloading position. In the board-loading/unloading position, the printed-wiring board 60 is transferred from a loading conveyor (not shown) onto the PWB supporting unit 62, and from the PWB supporting unit 62 onto an unloading conveyor (not show). In the component-mounting position, the PWB supporting unit 62 is moved in the X-axis and Y-axis directions to position the printed-wiring board 60 so that the electronic components 38 are mounted at predetermined component-mounting spots on the printed-wiring board 60.

The PWB supporting unit 62 is moved by the supporting-unit moving device 64 in a plane parallel to the surface of the printed-wiring board 60, in the horizontal plane in the present embodiment. The printed-wiring board 60 has a plurality of predetermined component-mounting spots or positions on its upper, component-mounting surface. With the PWB supporting unit 62 being moved, the predetermined component-mounting spots are sequentially brought into a predetermined component-mounting position of the component mounting device 16, as described below.

In the present embodiment, two fiducial marks (not shown) are provided on the upper surface of the printed-wiring board 60. Images of the fiducial marks are taken by an image-taking device in the form of a fiducial-mark camera 90, which is fixedly disposed as shown in FIG. 1. In the present embodiment, the fiducial-mark camera 90 includes a matrix of solid image sensors in the form of CCDs (charge-coupled devices), and a lens system, and functions as an image-taking device in the form of a surface-imaging device capable of taking a two-dimensional image of an object at one time. An illuminating device (not shown) is provided near the fiducial mark camera 90, to illuminate the object and its vicinity when the image of the object is taken by the fiducial-mark camera 90.

The component mounting device 16, which is constructed as disclosed in JP-B2-3050638, will be only briefly described. The component mounting device 16 includes a rotary body in the form of an indexing body 102, which is supported by a frame 100 provided on the machine base 10, such that the indexing body 102 is rotatable about its vertically extending axis. The indexing body 102 carries a plurality of component mounting heads 104 such that the component mounting heads 104 are equiangularly arranged in the rotating direction of the indexing body 102 and are vertically movable. The indexing body 102 has a roller (not shown) fixed to its upper end portion such that the roller is held in engagement with a cam groove (not shown) formed in a cylindrical cam 106. The indexing body 102 is intermittently rotated by a rotary drive device 103 (FIG. 1) at an angular interval corresponding to the angular spacing of the component mounting heads 104, so that the component mounting heads 140 are turned about the axis of rotation of the indexing body 102, and are sequentially moved to a plurality of working positions such as a component-receiving position, an image-taking position, a component-hold-position rectifying position and a component-mounting position, while the component mounting heads 104 are vertically moved up and down by an interaction of the roller and cam groove indicated above. The rotary drive device 103 includes an electric motor, and a motion converting device which includes a roller-gear cam and a roller gear and which is arranged to convert a continuous rotary motion of the electric motor into an intermittent rotary of the indexing body 102.

Each of the component mounting heads 104 has a nozzle holding member 110, and a plurality of component holders in the form of three suction nozzles 112 (only one of which is shown in FIG. 1). The nozzle holding member 110 is rotated by a nozzle-selecting drive device (not shown) so that the three suction nozzles 112 are selectively placed in an operating position for holding the electronic component 38 by suction. Each of the suction nozzles 112 is removably supported by a nozzle holder 111 held by the nozzle holding member 110, such that the suction nozzle 112 is vertically movable and rotatable by the nozzle holding member 110, together with the nozzle holder 111.

In the present embodiment, a component holding device 113 is constituted by the suction nozzle 112 placed in the operating position, the nozzle holder 111 supporting this suction nozzle 112, and one of a plurality of nozzle holding portions of the nozzle holding member 110, which holds the nozzle holder 111 supporting the suction nozzle 112 placed in the operating position. The component mounting device 16 has a plurality of component holding devices 113, which are disposed on the indexing body 102 such that the component holding devices 113 are equiangularly arranged in the rotating direction of the indexing body 102. These component holding devices 113 are sequentially stopped at the plurality of working positions such as the component-receiving position while the indexing body 102 is intermittently rotated. Each of the three suction nozzles 112 and the corresponding nozzle holder 111 may be considered to constitute the component holding device 113. In this case, each of the component mounting heads 104 has the three component holding devices. Alternatively, the three suction nozzles 112 of each component mounting head 104 may be considered to constitute the component holding device 113. In this case, each component mounting head 104 may be considered to function as the component holding device.

Each nozzle holder 111 is vertically movably and rotatably supported by the nozzle holding member 110, and is biased in the upward direction by a spring 116. The suction nozzle 112 includes a main body 114, and a suction tube 118 fitted in the main body 114, and is biased by a spring (not shown) in the downward direction, so that the lower portion of the suction nozzle projects from the nozzle holder 111. The suction nozzle 112 is arranged to hold the electronic component 38 by suction under a negative pressure. The suction nozzle 112 is provided with a light-emitting body in the form of a light-emitting plate 120 attached to its lower projecting portion. The light-emitting plate 120 has a lower light-emitting surface 122 which faces downwards toward the electronic component 38 held by the suction tube 118 and which is coated with a fluorescent material capable of absorbing a ultraviolet radiation and emitting a visible light.

At each of the component-receiving position and the component-mounting position, there is disposed a lifting and lowering device arranged to vertically move the component holding device 113 located at the component-receiving or component-mounting position, so that the suction nozzle 112 is lifted and lowered to receive the electronic component 38 from the component supply device 14 and transfer the electronic component 38 onto the printed-wiring board 60. At the component-hold-position rectifying position, there is disposed a rotating device arranged to rotate the component holding device 113 for rotating the suction nozzle 112. Namely, this rotating device is arranged to rotate the nozzle holder 111 about its axis relative to the nozzle holding device 110, for rotating the suction nozzle 112 to rectify the angular position of the electronic component 38 as held by the suction tube 118.

At the component-hold-position detecting position indicated above, there are fixedly disposed two sets of component camera 130, 132 and illuminating device 134. Like the fiducial-mark camera 90, each of the component cameras 130, 132 is a CCD camera which includes CCDs and a lens system and which functions as an image-taking device in the form of a surface-imaging device capable of taking a two-dimensional image of an object at one time, in the present embodiment. Each component camera 130, 132 has a matrix of multiple CCDs which have respective minute light-sensitive elements arranged in a plane and which generate electric signals depending upon the amounts of light received by the light-sensitive elements. The multiple light-sensitive elements collectively define an imaging area or field. The imaging area of each component camera 130, 132 is perpendicular to a centerline or axis C1, C2 (FIG. 3) and has a center on this axis C1, C2. The two component cameras 130, 132 have different magnification ratios. The component camera 130 has a lower magnification ratio and a wider field of view, than the component camera 132. In other words, the component camera 132 has a higher magnification ratio and a narrow field of view than the component camera 130. These two component cameras 130, 132 are selectively used depending upon the size of the electronic component 38.

Each of the component cameras 130, 132 is provided with a filter which permits transmission of a visible light but inhibits transmission of a ultraviolet radiation. The two component cameras 130, 132 are disposed on a portion of the frame 100 radially outside the indexing body 102, as shown in FIG. 1, and so as to face downwards, as shown in FIG. 2, such that the axes C1, C2 are parallel to each other and to the vertically extending axis of rotation of the indexing body 102 and lie on a straight line which passes the axis of the indexing body 102 and the axis of the suction nozzle 112 of the component holding device 113 stopped at the component-hold-position detecting device. In other words, the component cameras 130, 132 are positioned on the frame 100 such that the axes C1, C2 extend parallel to each other in the vertical direction and lie in a plane including the axis of the indexing body 102 and the axis of the suction nozzle 112 of the component holding device 113 at the component-hold-position detecting device, such that the axes C1, C2 are spaced apart from each other by a suitable distance in the radial direction of the indexing body 102. The vertical direction in which the axes C1, C2 of the component cameras 130, 132 extend will be referred to as a "first direction", while the direction which is perpendicular to the axes C1, C2 and in which the axes C1, C2 are spaced apart from each other will be referred to as a "second direction". In the present embodiment, the second direction is parallel to the horizontal direction and the radial direction of the indexing body 102.

Figure 3:
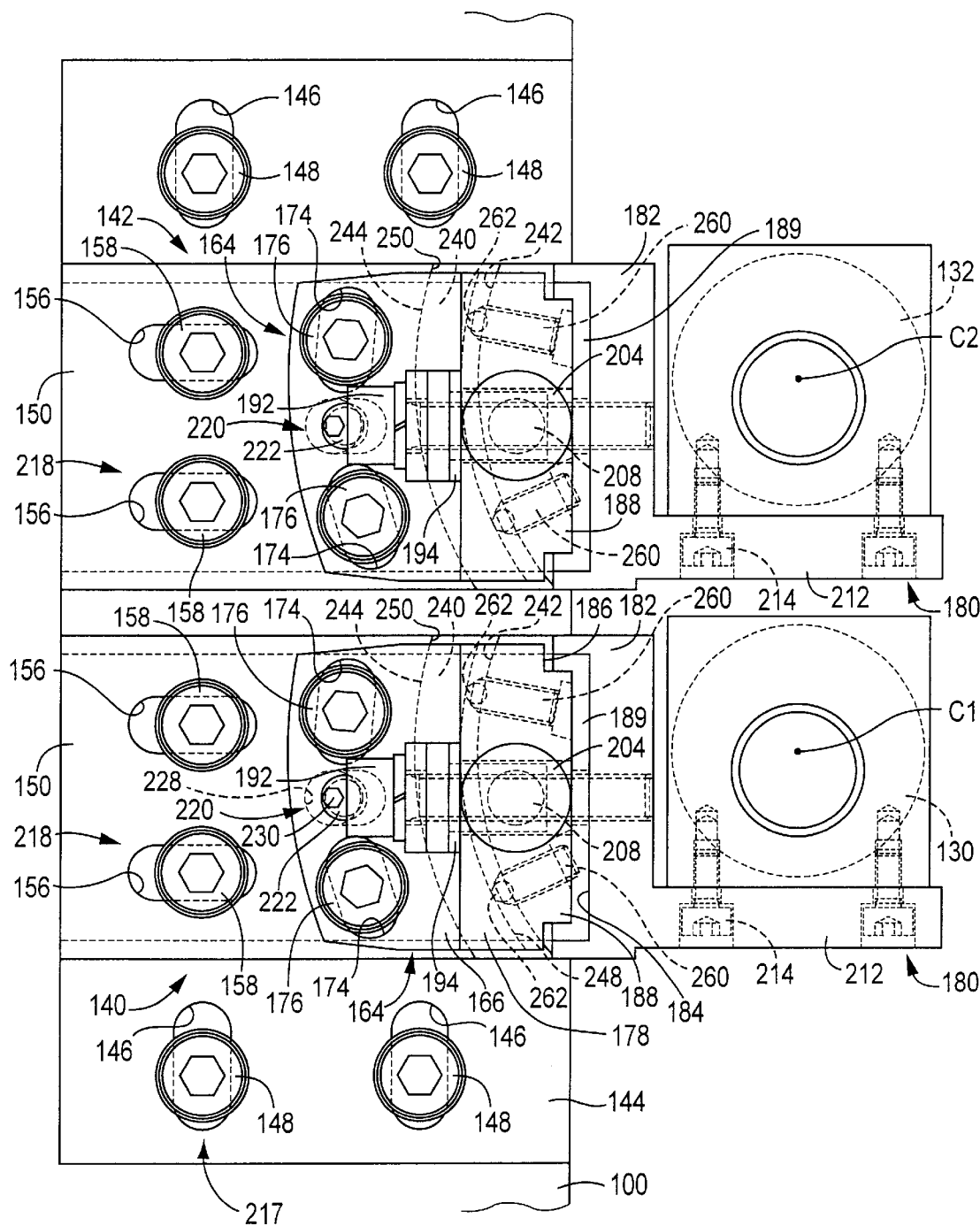
FIG. 3 is a plan view showing the angular position adjusting devices for adjusting the angular positions of the component cameras about their axes.
Figure 4:
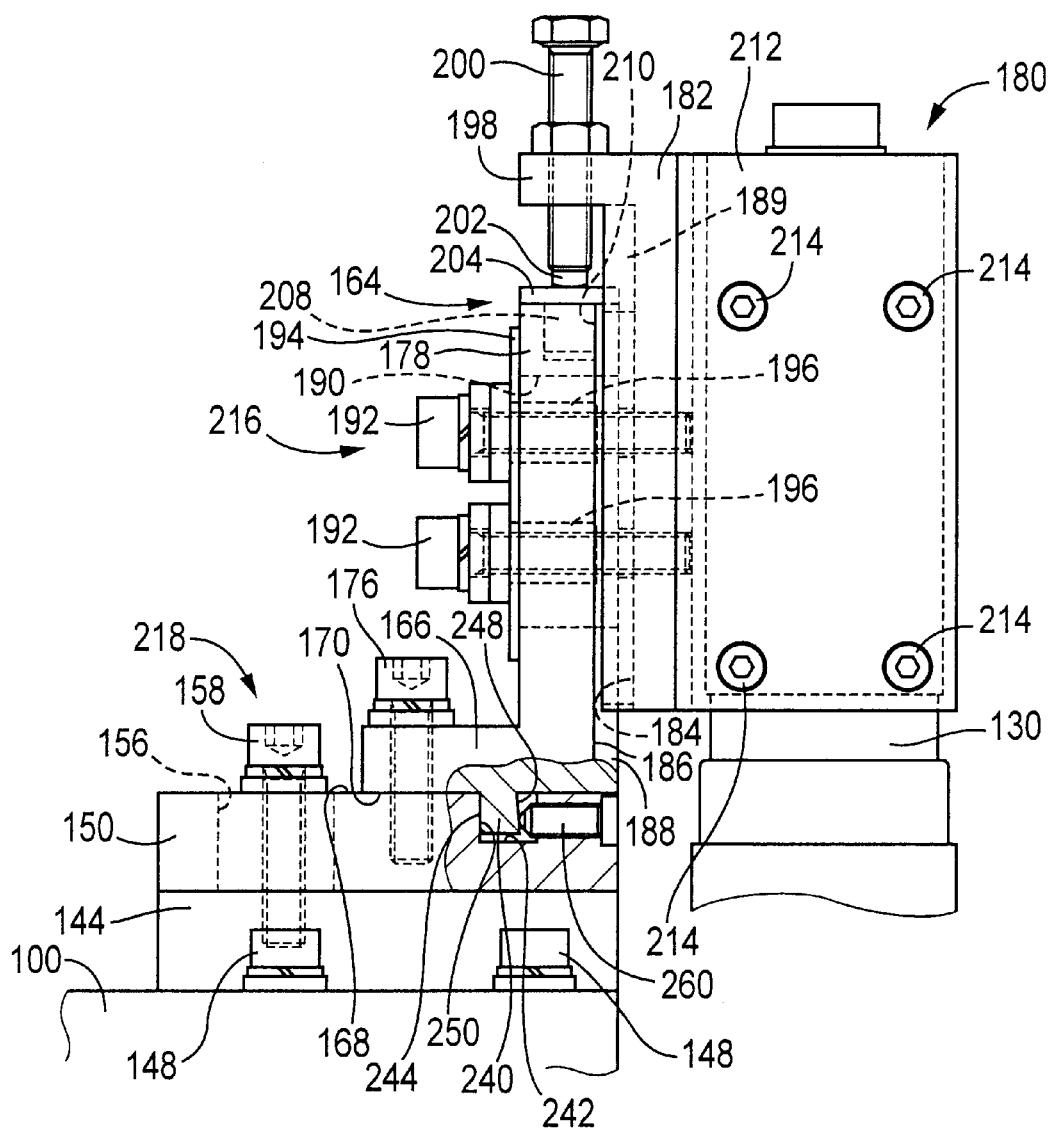
FIG. 4 is a side elevational view partly in cross section showing the angular position adjusting device for one of the two component cameras.

The two component cameras 130, 132 are rotatable about their axes C1, C2 by respective angular position adjusting devices 140, 142, so that the angular positions of the cameras 130, 132 about the axes C1, C2 are adjustable. The positions of each of the component cameras 130, 132 in the above-defined first and second directions are respectively adjustable by a first-direction position adjusting device 216 and a second-direction position adjusting device 217, which are generally indicated in FIGS. 4 and 3, respectively. Further, the position of each component camera 130, 132 in a third direction which will be described is adjustable by a third-direction position adjusting device 218 shown in FIG. 3. The angular position adjusting devices 140, 142 for the two component cameras 130, 132 are identical in construction with each other, and the first-, second- and third-direction position adjusting devices 216, 217, 218 for the component camera 130 are identical in construction with those for the component camera 132. There will be described, by way of example, the angular position adjusting device 140 and the first-, second- and third-direction position adjusting devices 216, 217, 218 for the component camera 130.

As shown in FIGS. 3 and 4, a mounting bracket in the form of a base plate 144 is removably fixed to the frame 100 such that the position of the base plate 144 is adjustable. The base plate 144 is used commonly for the two angular position adjusting devices 140, 142, and has an elongate rectangular shape with its longitudinal direction being parallel to the above-defined second direction (radial direction of the indexing body 102). The base plate 144 has a plurality of through-holes in the form of four elongate holes 146 formed so as to extend in the second direction. The base plate 144 is fixed to the frame 100 by screws 148 which are inserted through the respective elongate holes 146 and screwed into the frame 100. The base plate 144 thus fixed to the frame 100 by the screws 148 inserted through the elongate holes 146 is not rotatable relative to the frame 100, but the position of the base plate 144 in its longitudinal direction is adjustable.

A first bracket 150 is removably fixed on the base plate 144 such that the position of the first bracket 150 is adjustable. The first bracket 150 cooperates with the base plate 140 to constitute a second member. The first bracket 150 is an elongate rectangular plate having a plurality of through-holes in the form of two parallel elongate holes 156 formed so as to extend in a direction (hereinafter referred to as a "third direction") perpendicular to the second direction, in a horizontal plane perpendicular to the axis C1 of the component camera 130. This third direction, which is the longitudinal direction of the elongate holes 156, is parallel to the direction of tangency to a circular path of turning movement of each component mounting head 104 about the axis of rotation of the indexing body 102. The first bracket 150 is removably fixed to the base plate 144 by screws 58 inserted through the elongate holes 156 and screwed into the base plate 144, such that the longitudinal direction of the first bracket 150 is parallel to the third direction. Since the first bracket 150 is fixed to the base plate 144 at two positions, the first plate 150 is not rotatable relative to the base plate 144, but the position of the first plate 150 in the third direction is adjustable by changing the relative position between the elongate holes 156 and the screws 158. In the present embodiment, the third direction is parallel to the horizontal direction and the tangential direction with respect to the rotating direction of the indexing body 102.

The first bracket 150 holds a second bracket 164, at one longitudinal end portion of the first bracket 150, such that the second bracket 164 is rotatable about the axis C1 of the component camera 130. As shown in FIGS. 3 and 4, the second bracket 164 is generally L-shaped in cross section with a pair of arm portions 166, 178, and has a width slightly smaller than that of the first bracket 150. The second bracket 164 rests on the first bracket 150, at the arm portion 166, such that the lower surface of the arm portion 166 which serves as a contacting surface 170 is held in contact with the upper surface of the first bracket 150 which serves as a contacting surface 168.

The arm portion 166 has a plurality of through-holes in the form of two elongate holes 174 through which respective screws 176 are inserted and screwed into the first bracket 150, for removably fixing the second bracket 164 to the first bracket 150. A force by which the second bracket 164 is fixed to the first bracket 150 can be increased by increasing a force of tightening of the screws 176 to increase a contact pressure between the contacting surfaces 168, 70. In the present embodiment, the screws 176 function as a tightening device for fixing the second bracket 164 to the first bracket 150. The configuration of each elongate hole 174 will be described.

The other arm portion 178 of the L-shaped second bracket 164 extends at right angles from the arm portion 166, that is, in the vertical direction, and has a side surface 186 which is remote from the arm portion 166 and to which a third bracket 180 is attached. As shown in FIG. 3, the third bracket 180 is generally L-shaped in transverse cross section, having a pair of arms 182, 212. The arm portion 182 has a guided portion in the form of a guide groove 184 which engages a guide member in the form of a vertically extending guide rail 188 provided on the vertical side surface 186 of the arm portion 178, such that the third bracket 180 is slidably movable on the guide rail 188. The inner surface of the guide groove 184 is covered by an electric insulator 189, so that the third bracket 180 is held in engagement with the guide rail 188 via a layer of the electric insulator 189. The electric insulator 189 is formed of a material having a high degree of electrically insulating property, such as a synthetic resin material, for example, a glass epoxy resin.

The arm portion 178 having the guide rail 188 has a through-hole in the form of an elongate hole 190 formed through the thickness of a widthwise central portion thereof, such that the elongate hole 180 extends in the vertical direction. In the present embodiment, two screws 192 are inserted through the elongate hole 190 and screwed into the third bracket 180, as shown in FIG. 4, so that the third bracket 5 180 is fixed to the second bracket 164. The screws 192 are movable relative to the elongate hole 190 in the above-defined first direction, so that the position of the third bracket 180 in the third direction is adjustable. Between the heads of the screws 192 and the arm portion 178, there is interposed a common plate 194 through which the stud portions of the screws 192 extend to be inserted through the elongate hole 190. The plate 194 closes the opening of the elongate hole 190, and functions to increase an area of contact of the head of each screw 192 with the arm portion 178 when the screws 192 are screwed into the third bracket 190. A flanged bushing 196 is mounted on each screw 192, and the screws 192 is inserted through the elongate hole 190, together with the bushing 196. Like the electric insulator 189, the busing 196 is formed of a material having a high degree of electrically insulating property, such as a glass epoxy resin.

As shown in FIG. 4, the arm portion 182 of the third bracket 180 includes a projecting portion 198 formed at its upper end so as to extend over the second bracket 164. An operating portion in the form of an operating screw 200 is screwed through a tapped hole formed through the projecting portion 198, so as to extend downwards toward the arm portion 178 of the second bracket 164. The operating screw 200 is provided at its lower end with a contacting portion 202 has a part-spherical outer surface and which is held in contact with a contacting member 204 provided on the arm portion 178. Since the guide groove 184 of the third bracket 180 engages the guide rail 188 prevents the third bracket 180 from rotating about a vertical axis relative to the second bracket 164, rotating the operating screw 200 causes the third bracket 180 to be vertically moved while being guided by the guide rail 188. It is noted that the projecting portion 198 and the operating screw 200 are not shown in FIG. 3, to avoid complexity of the figure.

The contacting member 204 is a stepped cylindrical member including a fitting portion 208 fitted in a fitting hole 210 formed in the arm portion 178. Like the electric insulator 189 and the bushings 196, the contacting member 204 is formed of a material having a high degree of electrically insulating property such as a glass epoxy resin.

The other arm portion 212 of the L-shaped third bracket 180 extends at right angles from the arm portion 182, in the direction away from the second bracket 164, as shown in FIG. 3. To this arm portion 212, there is removably fixed the component camera 130 by a fixing device in the form of two screws 214, such that the axis C1 of the component camera C1 extends in the vertical direction. In the present embodiment, the second and third brackets 164, 180 cooperate to constitute a first member which holds the component camera 130, and the contacting surfaces 168, 170 formed on the respective first and second brackets 150, 164 are held in contact with each other in the first direction parallel to the axis C1 of the component camera 130, so that the relative position between the first and second brackets 150, 164 in the first direction.

The positions of the component camera 130 in the first, second and third directions are adjusted by adjusting the position of the base plate 144 in the second direction, the position of the first bracket 150 in the third direction and the position of the third bracket 180 in the first direction. In the present embodiment, the elongate hole 190 and the screws 192 cooperate to constitute the first-direction position adjusting device 217, and the elongate holes 146 and the screws 148 cooperate to constitute the second-direction position adjusting device 218, while the elongate holes 156 and the screws 158 cooperate to constitute the third-direction position adjusting device 218. By adjusting the position of the base plate 144 in the second direction and the position of the first bracket 150 in the third direction, the axis C1 of the component camera 130 can be positioned in the horizontal plane perpendicular to the axis C1, that is, can be located to lie in a vertical plane which includes the axis of rotation of the indexing body 102 and the axis of the suction nozzle 112 of the component holding device 113 located at the component-hold-position detecting position.

The third bracket 180 to which the component camera 130 is fixed is held in engagement with the second bracket 164 via the electric insulator 189, bushings 196 and contacting member 204, so that the component camera 130 is electrically insulated from the frame 100, to prevent an influence of an electrical noise on the output of the component camera 130.

Figure 6:
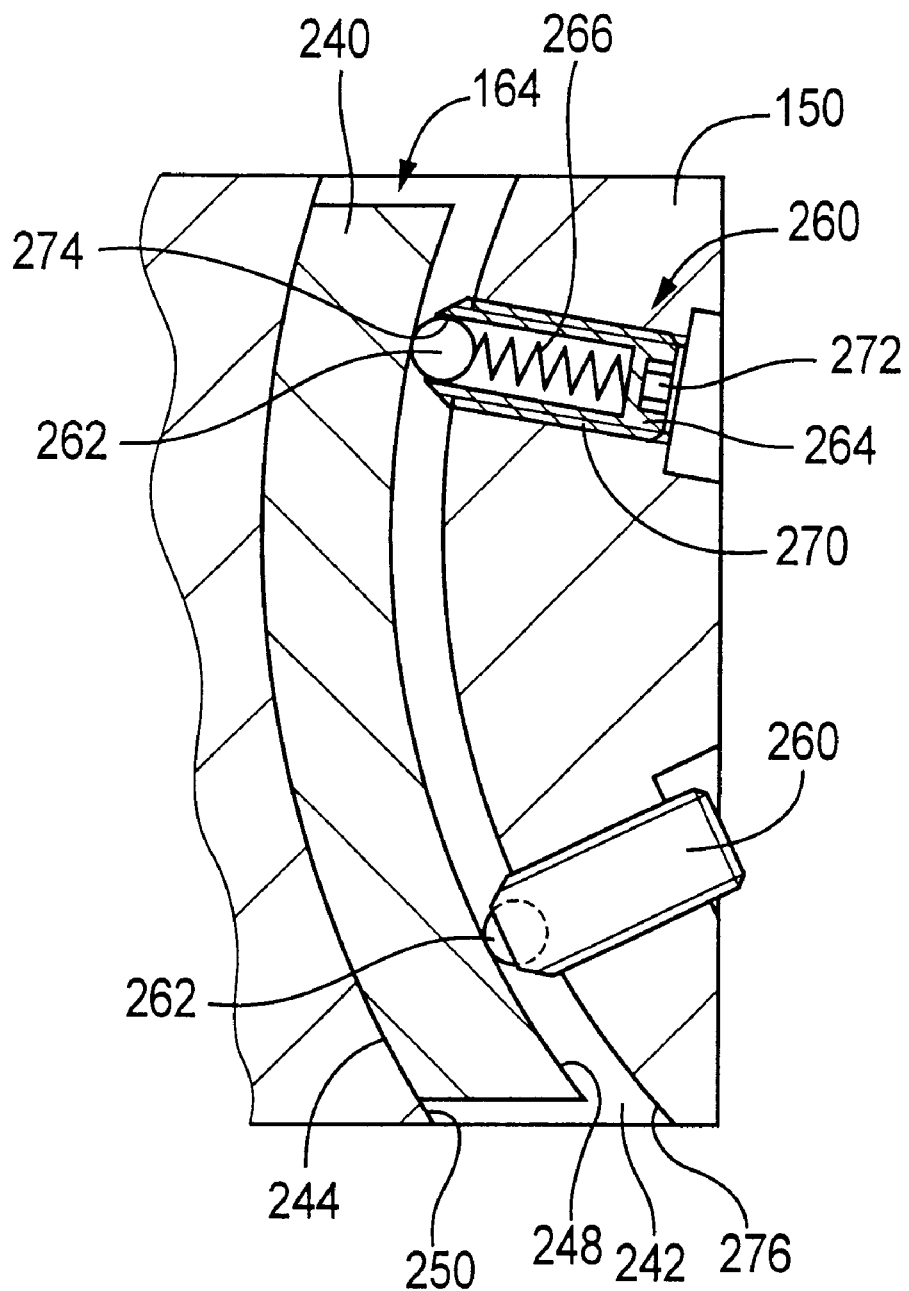
FIG. 6 is a plan view partly in cross section showing a ball plunger of the angular position adjusting device of FIG. 4.

Between the first and second brackets 150, 164, there is interposed a rotating mechanism 220. As shown in FIGS. 3 and 6, the rotating mechanism 220 includes a drive member 222, which is a stepped cylindrical member including an axial end portion in the form of a shaft portion 224 fitted in the first bracket 150 such that the drive member 222 is rotatable about a vertical axis.

The other axial end portion of the drive member 222 serves as a drive portion 226 having a larger diameter than the shaft portion 224. The drive member 222 is formed such that the drive portion 226 is eccentric with respect to the shaft portion 224. The drive portion 226 is held in engagement with an elongate hole 226 formed in the arm portion 166 of the second bracket 164 such that the drive portion 226 is movable relative to the elongate hole 226. The elongate hole 228 is located between the above-indicated two elongate holes 174, and is a blind hole which is open in the contacting surface 170 and formed so as to extend in a direction of extension of the arm portion 178.

The second bracket 164 is initially fixed to the first bracket 150 such that the longitudinal direction of the elongate hole 228 is parallel to the third direction while a straight line which passes the centerlines of the drive portion 226 and shaft portion 224 and which is perpendicular to these centerlines is parallel to the third direction, and such that the centerline of the drive portion 226 is more distant from the component camera 130 than the centerline of the shaft portion 224, so that there is a gap between the drive portion 226 and one of the longitudinally opposite ends of the elongate hole 228 which is nearer to the component camera 130. In this state of fixing of the second bracket 164 to the first bracket 150, the second bracket 164 is rotatable about the axis C1 by the same angle in both of the clockwise and counterclockwise directions, by rotating the drive portion 226 about the centerline of the shaft portion 224.

Figure 5:
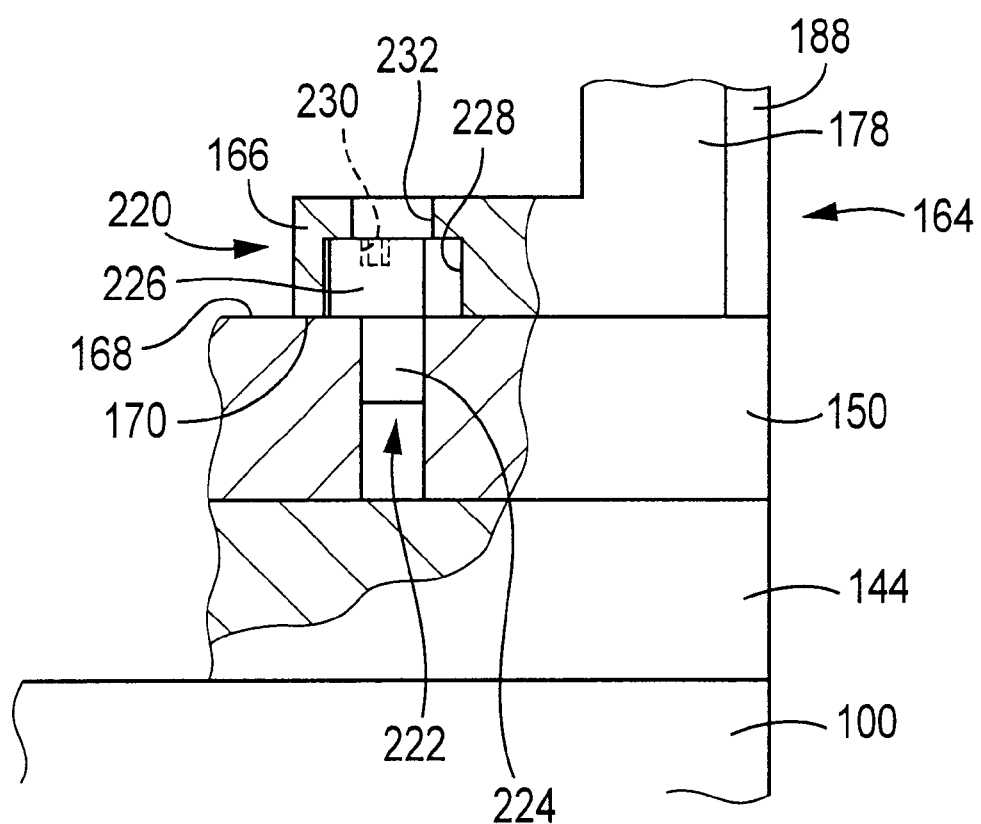
FIG. 5 is a side elevational view partly in cross section showing a rotating mechanism of the angular position adjusting device of FIG. 4.

The drive portion 226 has a tool-engageable portion in the form of an engaging recess 230 having a hexagon shape in cross section and formed in its upper surface such that the engaging recess 230 is located at the centerline of the drive portion 226, which is spaced from the end face of the head of each screw 192 in the horizontal direction, as shown in FIGS. 3 and 4. The arm portion 166 has a hole 232 open in its upper surface and the elongate hole 228. This access hole 232 has a diameter enough to permit a suitable tool such as a hexagon wrench key to be brought into engagement with the engaging recess 230. In the example of FIG. 5, the diameter of the access hole 232 is larger than that of the shaft portion 224, and is located coaxially with the shaft portion 224.

As shown in FIGS. 3 and 4, the second bracket 164 has an arcuate protrusion 240 formed on its contacting surface 170. This arcuate protrusion 240 is loosely fitted in an arcuate groove 242 open in the contacting surface 168 of the first bracket 150. The arcuate protrusion 240 has a substantially rectangular shape in vertical cross section as seen in FIG. 4, and is formed as a part of an annular protrusion concentric with a circle which has a center at the axis C1 of the component camera 130 fixed to the third bracket 180, as shown in FIG. 6. In the example of FIG. 6, the arcuate protrusion 240 has a circumferential length corresponding to a center angle of about 55° of the above-indicated circle. The outer arcuate surface of the arcuate protrusion 240 on the radially outer side of the above-indicated circle functions as a guided surface in the form of a part-cylindrical convex surface 244 corresponding to an arc of the above-indicated circle. The inner arcuate surface of the arcuate protrusion 240 on the radially inner side of the circle functions as a part-cylindrical contacting surface in the form of a part-cylindrical concave contacting surface 248. This concave surface 248 is inclined such that a thickness of the arcuate protrusion 240 which is a distance between the convex and concave surfaces 244, 248 decreases in a direction from the free end of the arcuate protrusion 240 toward the fixed end, that is, in the upward direction as seen in FIG. 4. Thus, the shape of the arcuate protrusion in vertical cross section is substantially rectangular, with one of the four sides being slightly inclined.

The arcuate groove 242 has a rectangular shape in vertical cross section as seen in FIG. 4, and is formed as a part of an annular groove concentric with the above-indicated circle whose center lies at the axis C1 of the component camera 130. The arcuate groove 242 has a circumferential length corresponding to a center angle of the above-indicated circle, which is slight larger than that of the arcuate protrusion 240. The arcuate groove 242 has a width larger than the thickness or width of the arcuate protrusion 240. The arcuate surface of the arcuate groove 242 on the radially outer side of the above-indicated circle is a part-cylindrical concave surface 250 serving as a guiding surface for contact with the guided surface in the form of the part-cylindrical convex surface 244.

Between the first bracket 150 and the second bracket 164, there is interposed a biasing device in the form of two ball plungers 260, which biases the first and second brackets 150, 164 toward each other so that the part-cylindrical convex surface 244 is held in close contact with the part-cylindrical convex surface 2440, as shown in FIG. 6. However, the biasing device may consist of one ball plunger 260. The two ball plungers 260 are identical in construction with each other.

Each ball plunger 260 includes a ball 262, a ball holder in the form of a casing 264, and an elastic member in the form of a spring 266, as shown in FIG. 6. This ball plunger 260 which is arranged to be operable as a biasing device as described is commercially available and called "ball plunger" as in the present embodiment.

The casing 264 is a generally cylindrical container, and has an externally threaded outer circumferential surface 270, and a bottom wall which has an engaging recess 272 in its outer surface. The engaging recess 272, which serves as a tool-engageable portion, has a hexagon shape in cross section. The ball 262 is accommodated within the casing 264 such that the ball 262 can roll. A spring 266 is disposed within the casing 264, to bias the ball 262 in a direction from the bottom wall toward an opening 274 at the open end of the casing 264. Accordingly, the ball 262 is normally held in a position in which a part of the ball 262 projects from the opening 274. Namely, the opening 274 has a diameter smaller than the diameter of the ball 262, so that the ball 262 is prevented from being removed from the casing 264, with the ball 262 held in abutting contact with an inner annular edge of the opening 272.

The casing 264 is screwed at the externally threaded outer circumferential surface 270, in a portion of the first bracket 150 which has a part-cylindrical convex surface 276 which partially defines the arcuate groove 242 and which is opposed to the part-cylindrical concave surface 250. The casing 264 is screwed in the first bracket 150, so as to extend in the radial direction of the component camera 130 so that the ball 262 is opposed to the part-cylindrical concave surface 250 of the arcuate groove 242.

With the arcuate protrusion 240 fitted in the arcuate groove 242, the casing 264 screwed in the first bracket 150 is positioned relative to the arcuate groove 242 such that the ball 262 is held in abutting contact with the part-cylindrical concave contacting surface 248 of the arcuate protrusion 240 under a biasing action of the spring 266, while the ball 262 is spaced apart from the above-indicated inner annular edge of the opening 274 against the biasing force of the spring 266 and is partially located outside the casing 264. In this state, the part-cylindrical convex surface 244 and the part-cylindrical concave surface 250 are held in pressing close contact with each other, with the biasing force of the spring 266.

As described above, the width of the arcuate groove 242 is larger than that of the arcuate protrusion 240, and the open end portion of the casing 264 projects a suitable distance from the part-cylindrical convex surface 276 of the arcuate groove 242 so that the ball 262 is held in abutting contact with the part-cylindrical concave contacting surface 248 of the arcuate protrusion 240, for holding the part-cylindrical convex surface 244 and the part-cylindrical concave surface 240 in close contact with each other, while a suitable gap is maintained between the part-cylindrical concave contacting surface 248 and the part-cylindrical convex surface 276.

Each of the elongate holes 174 which are formed through the arm portion 166 of the second bracket 164 and through which the screws 176 are inserted is an arcuate elongate hole formed along an arc of a circle which has a center at the axis C1 of the component camera 130. Accordingly, the arcuate elongate holes 174 permit the second bracket 164 to be rotated about the axis C1. Thus, the first member which holds the component camera 130 and which is constituted by the second and third brackets 164, 180 is supported by a second member constituted by the first bracket 150, such that the first member is rotatable about the axis C1. The arcuate elongate holes 174 formed through the second bracket 164 and the tapped holes formed in the first bracket 150 for engagement with the screws 176 are positioned so that each screw 176 is screwed in the tapped hole when the screw 176 is located intermediate between the longitudinal end of the arcuate elongate hole 174 while the straight line passing the centerlines of the drive portion 226 and shaft portion 224 of the rotating mechanism 220 is parallel to the above-defined third direction.

The angular position adjusting device 142 for the component camera 132 is identical in construction with the angular position adjusting device 140 for the component camera 130. The same reference signs as used for the angular position adjusting device 140 are used in the drawing, for the angular position adjusting device 142. The angular adjusting device 142 which holds the component camera 132 is located adjacent to the angular position adjusting device 140, that is, on one side of the device 140 remote from the indexing body in the above-defined second direction, namely, outwardly of the device 140 in the radial direction of the indexing body 102. Accordingly, the component camera 132 is located outwardly of the component camera 130 in the radial direction of the index body 102 such that the axis C2 of the component camera 130 lies in a vertical plane which passes the axis of the indexing body 102 and the axis of the suction nozzle 112 of the component holding device 113 located at the component-hold-position detecting position.

As shown in FIGS. 3 and 4, the component camera 130, and the first, second and third brackets 150, 164, 180 and the rotating mechanism 220 of the angular position adjusting device 140 are arranged in a straight row parallel to the third direction. Similarly, the component camera 132, and the above-indicated elements of the angular position adjusting device 142 are arranged in the third direction. In the present embodiment, the first, second and third brackets 150, 164, 180, rotating mechanism 220, arcuate protrusion 240 and arcuate groove 242 are disposed on one of the opposite sides of the component camera 130, 132 as seen in the third direction.

In the present embodiment, two assemblies including the respective component cameras 130, 132 and the respective angular position adjusting devices 140, 142 are arranged such that the axes C1, C2 of the component cameras 130, 132 extend in parallel with each other in the above-indicated vertical plane such that the axes C1, C2 are spaced from each other by a predetermined distance in the radial direction of the indexing body 102. Each of the two assemblies further include the second member consisting of the base plate 144 and the first bracket 150, the first member consisting of the second and third brackets 164, 180, and the rotating mechanism 220. The two first members 164, 180 corresponding to the respective component cameras 130, 132 are spaced from each other in the above-defined second direction, that is, in a direction parallel to the above-indicated vertical plane and perpendicular to the axes C1, C2. Similarly, the two second members 144, 150 corresponding to the respective component cameras 130, 132 are spaced from each other in the second direction.

An optical guiding device in the form of a prism device 280 is disposed in opposed relation with the component cameras 130, 132, as shown in FIG. 2. The prism device 280 includes a casing 282, two half mirrors 284, 286 and a total reflection mirror 288, which are disposed within the casing 282. The half mirror 284 is positioned right below and in opposed relation with the suction nozzle 112 placed in the operating position on the component holding device 113 located at the component-hold-position detecting device. The half mirror 284 is arranged to permit transmission of a portion of an incident light and reflect the other portion, when the electronic component 38 is irradiated with a light on a selected one of its opposite sides as discussed below. The half mirror 286 is positioned in opposed relation with the component camera 130, to reflect a portion of the light component reflected by the half mirror 284, so that the light component reflected by the half mirror 286 is incident upon the component camera 130. The total reflection mirror 288 is positioned in opposed relation with the component camera 132, to reflect the light component which has transmitted through the half mirror 286, so that the light component reflected by the total reflection mirror 288 is incident upon the component camera 132. In the present embodiment, the half mirror 284 serves as a light-receiving portion of the optical guiding device in the form of the prism device 280, while the half mirror 286 and the total reflection mirror 288 cooperate to constitute a light-distributing portion of the optical guiding device.

The illuminating device 134, which is constructed as disclosed in JP-A-5-196441, includes a light-emitting body 290, as shown in FIG. 2. The light-emitting body 290 is disposed below the prism device 280 and coaxially with the suction nozzle 112 placed in the operating position. The light-emitting body 290 includes a casing 292, a multiplicity of optical fibers (not shown) accommodated in the casing 292, and an optical tube 294 partly accommodated in the casing 292. The optical fibers are fixed within the casing 292 such that one of opposite end portions of each optical fiber faces upwards while the other end portions of the optical fibers are bundled together within the corresponding end portion of the optical tube 294 which is accommodated within the casing 292. The other end of the optical tube 294 is opposed to a suitable light source (not shown) such as a mercury lamp. Between the above-indicated other end portions of the optical fibers and the light source, there is interposed a filter device so that the light-emitting light 290 selectively emits a visible light and a ultraviolet radiation. When the light-emitting surface 122 of the suction nozzle 112 is irradiated with the ultraviolet radiation emitted from the light-emitting body 290, the ultraviolet radiation is converted by the light-emitting surface 122 into a visible light to irradiate the upper surface of the electronic component 38, so that a projection image or a silhouette image of the electronic component 38 is taken by the component cameras 130, 132. When the visible light is emitted from the light-emitting body 290 toward the suction nozzle 112, the lower surface of the electronic component 38 held by the suction nozzle 112 is irradiated with the visible light, and the visible light is reflected by the lower surface of the electronic component 38 at which the electronic component 38 is mounted on the printed-wiring board 60. In this case, a normal front image of the electronic component 38 is taken by the component cameras 130, 132.

The present electronic-component mounting system 12 includes a control device 300 (FIG. 1) constituted principally by a computer. The control device 300 controls various actuators such as a motor to rotate the indexing body 102, and other motors. In the present embodiments, the motors are rotary electric motors in the form of servomotors whose operating angles can be controlled with high accuracy. However, stepping motors may be used in place of the servomotors.

When the electronic-component mounting system 12 constructed as described above is operated to mount the electronic components 38 on the printed-wiring board 60, the electronic component 38 is held by suction by the suction nozzle 112 placed in the operating position on each component holding device 113 when the component holding device 113 is stopped at the component-receiving position. Then, the horizontal and angular positions of the electronic component 38 as held by the suction nozzle 112 are detected when the suction nozzle 112 is stopped at the component-hold-position detecting position. However, the detection of the positions of the electronic component 38 may be performed by taking an image of the electronic component 38 while the suction nozzle 112 is moved (while the corresponding component holding device 113 is turned with the indexing body 102). To detect the positions of the electronic component 38, the ultraviolet radiation is emitted by the light-emitting body 290 of the illuminating device 134, toward the electronic component 38. The emitted ultraviolet radiation is transmitted through the half mirror 284, and is incident upon the light-emitting surface 122, which coverts the ultraviolet radiation into the visible light, which irradiates the electronic component 38, so that a silhouette image of the electronic component 38 is taken by the component cameras 130, 132. Thus, the light-emitting plate 120 may be considered as a part of the illuminating device 134. For some kinds of the electronic component 38, the light-emitting body 290 emits the visible light to take a normal front image of the electronic component 38.

The light which forms the silhouette image of the electronic component 38 is reflected by the half mirror 284, and a portion of the light reflected by the half mirror 284 is reflected by the half mirror 286 and is incident upon the component camera 130, while the other portion is reflected by the total reflection mirror 288 and is incident upon the component camera 132. Thus, the silhouette images of the electronic component 38 are taken by the two component cameras 130, 132. However, one of these two silhouette images is used to detect positioning errors of the electronic component 38, depending upon the specific size of the electronic component 38.

The taken image of the electronic component 38 is compared with a reference image, to calculate horizontal positioning errors $\Delta XE$ and $\Delta YE$ and an angular positioning error $\Delta \theta E$ of the electronic component 38. The horizontal positioning errors $\Delta XE$ and $\Delta YE$ are positioning errors of the center of the electronic component 38 with respect to the axis of the nozzle holder 111, and the angular positioning error $\Delta \theta E$ is an error of the angular position of the electronic component 38 about a vertical axis. When the suction nozzle 112 has been moved to the component-hold-position rectifying position, the suction nozzle 112 is rotated about its axis, to eliminate the calculated angular positioning error $\Delta \theta OE$. Further, distances of movements of the printed-wiring board 60 in the X-axis and Y-axis directions are compensated for the calculated horizontal positioning errors $\Delta XE$ and $\Delta YE$. Accordingly, the electronic component 38 can be mounted at the nominal mounting spot on the printed-wiring board 60, with the nominal angular position. At the same time, the movement distances of the printed-wiring board 60 are also compensated for horizontal positioning errors $\Delta XP$ and $\Delta YP$ of the printed-wiring board 60, and horizontal positioning errors of the electronic component 38 which arise due to the compensation for the angular positioning error $\Delta \theta E$. The horizontal positioning errors $\Delta XP$ and $\Delta YP$ of the printed-wiring board 60 are detected on the basis of images of the fiducial marks provided on the board 60, which are taken by the fiducial-mark camera 90 prior to initiation of the component mounting operation on the board 60. If it is detected that the electronic component 38 cannot be mounted on the board 60, due to excessively large positioning errors that cannot be corrected, for instance, the electronic component 38 is discarded or otherwise disposed, to prevent a defective printed-circuit board.

Thus, the component cameras 130, 132 are provided to take the image of the electronic component 38 as held by the suction nozzle 112 prior to mounting the electronic component 38 on the printed-wiring board 60. The positions of the component cameras 130, 132 are adjusted during manufacture or maintenance service of the electronic-component mounting system 12. Namely, the angular positions of the component cameras 130, 132 about their axes C1, C2 are adjusted by using the respective angular position adjusting devices 140, 142, and the positions of the component cameras 130, 132 in the first, second and third directions are adjusted by using the respective first-direction, second-direction and third-direction position adjusting devices 216, 217 and 218. Since the adjustments of the positions of the two component cameras 130, 132 by the angular position adjusting devices 140, 142, etc. are effected in the same manner, there will be described only the adjusts of the positions of the component camera 130, by way of example.

The positions of the component camera 130 are adjusted to establish predetermined positions of the imaging area of the component camera 130 in the first, second and third directions, and a predetermined angular position about the axis C1. These position adjustments are manually performed by the operator or use of the electronic-component mounting system 12. Initially, the positioning of the axis C1 of the component camera 130 in the XY plane is effected, that is, the positions of the axis C1 in the second and third directions are adjusted.

In the XY coordinate system at the component-mounting position in the present embodiment, the X-axis direction is the direction in which the component-supply portions of the tape feeders 36 are arranged, while the Y-axis direction is perpendicular to the X-axis direction, and the X-axis and Y-axis directions define the XY plane parallel to the horizontal surface of the printed-wiring board 60. In the XY coordinate system at the component-hold-position detecting position, that is, in the XY coordinate system rotated about the axis of rotation of the indexing body 102 from the component-mounting position to the component-hold-position detecting position, the X-axis direction is parallel to the above-defined second direction (radial direction of the indexing body 102) while the Y-axis direction is parallel to the above-defined third direction (direction of tangency to the circular periphery of the indexing body 102). The XY coordinate system at the component-hold-position detecting position is the XY coordinate system of the imaging area of the component camera 130. The positive and negative directions of the X-axis and Y-axis directions in the XY coordinate system in the imaging area are the same as those in the XY coordinate system at the component-mounting position.

The positions of the axis C1 of the component camera 130 in the second and third directions are adjusted so that the axis of rotation of the nozzle holder 111 or the suction nozzle 112 of the component holding device 113 located at the component-hold-position detecting position is aligned with an imaging center of the component camera 130, that is, the center of the imaging area or field of the component camera 130, which center lies on the axis C1. The position of the axis of rotation of the nozzle holder 111 can be obtained by processing two sets of image data indicative of the positions of the center of two normal front images of the end face of the suction tube 118 of the suction nozzle 112 placed in the operating position, which two normal front images are taken by the component camera 130 at respective two angular positions of the suction nozzle 112, for instance, 180°-spaced-apart angular positions, by rotating the nozzle holder 111 holding the suction nozzle 112.

After the first image of the end face of the suction tube 118 of the suction nozzle 112 has been taken at a first angular position of the suction nozzle 112 of the nozzle holder 111 at the component-hold-position detecting position, the nozzle holder 111 is rotated by 180°, to take the second image of the end face of the suction tube 118 at a second angular position of the suction nozzle 112 which is spaced from the first angular position by 180°. A midpoint between the center positions of the thus taken two images of the end face of the suction tube 118 is determined as the position of the axis of rotation of the nozzle holder 111. The axis C1 of the component camera 130 is moved in the second and third directions so that the center of the imaging area (the axis C1) is aligned with the thus determined position of the axis of rotation of the nozzle holder 111. On the basis of the calculated position of the axis of rotation of the nozzle holder 111, distances of deviation of the center of the imaging area from the axis of rotation of the nozzle holder 111 in the second and third directions are calculated, and the calculated distances of deviation are displayed on a suitable display device (not shown). The operator adjusts the positions of the component camera 130 in the second and third directions, so as to eliminate the distances of deviation, while observing the distances of deviation displayed on the display device.

To make the adjustments of the positions of the component camera 130 in the second and third directions, the screws 148, 158 are loosened, and the base plate 144 is moved relative to the frame 100, while the first bracket 150 is moved relative to the base plate 144, so that the distances of deviation between the axis of the nozzle holder 111 and the axis C1 are zeroed. Then, the screws 148, 158 are tightened again, to fix the base plate 144 to the frame 100, and fix the first bracket 150 to the base plate 144.

Thus, the positions of the component camera 130 in the X-axis and Y-axis directions of the XY coordinate system of the imaging area are adjusted by adjusting the positions of the component camera 130 in the second and third directions, such that the axis C1 is located at the predetermined positions in the second and third directions, that is, such that the axis C1 lies in the vertical plane including the axis of rotation of the indexing body 102 and the axis of the suction nozzle 112 of the component holding device 113 located at the component-hold-position detecting position, and such that the axis C1 is located at the predetermined position in the radial direction of the indexing body 102 parallel to the above-indicated vertical plane., so that the component camera 130 is positioned so as to reliable operations to take accurate images of the object.

Then, the angular position of the component camera 130 is adjusted. To make this angular position adjustment, a reference jig (not shown) is used, for example. The reference jig includes a cylindrical mounting portion at which the jig is held by the nozzle holder 111, and a reference-position detecting portion which is formed at the free end of the mounting portion and which has a quadrangular or tetragonal shape, such as a rectangular or square shape in cross section. This reference jig is used to establish the predetermined angular position of the nozzle holder 111. To this end, the reference jig is mounted on the nozzle holder 111 of the component holding device 113 of a selected one of the component mounting heads 104, such that the reference jig is rotatable relative to the nozzle holder 111. The indexing body 102 is rotated to move this nozzle holder 111 at the component-mounting position. Then, the predetermined angular position of the nozzle holder 111 is established such that one pair of parallel sides of the quadrangular reference-position detecting portion are parallel to the X-axis direction while the other pair of parallel sides are parallel to the Y-axis direction. To establish the parallelism, a dial indicator is set with its plunger held in contact with one of the four sides of the reference-position detecting portion, and the dial indicator is moved in the X-axis direction, for example. The angular position of the nozzle holder 111 is adjusted by rotating the nozzle holder 111, if the reading of the dial indicator changes during its movement in the X-axis direction. The adjustment of the angular position of the nozzle holder 111 is repeated until the reading of the dial indicator becomes constant during its movement. In this way, the predetermined angular position of the nozzle holder 111 can be established, with the two pairs of sides of the reference-position detecting portions made parallel to the respective X-axis and Y-axis directions. This angular position adjustment of the nozzle holder 111 may be made by moving the dial indicator in the Y-axis direction while the plunger is held in contact with one of the four sides of the reference-position detecting portion of the jig.

After the predetermined angular position of the nozzle holder 111 has been established by using the reference jig, the nozzle holder 111 is moved together with the reference jig, to the component-hold-position detecting position, and the normal front image of the reference-position detecting portion of the jig is taken by the component camera 130. Image data indicative of the image of the reference-position are processed to calculate an amount of deviation of the angular position of the imaging area of the component camera 130 with respect to the angular position of the reference-position detecting portion. The calculated amount of deviation of the angular position is displayed on the display device, so that the operator may adjust the angular position of the component camera 130 by rotating it about its axis C1, so as to zero the deviation, while observing the displayed amount of deviation.

To rotate the component camera 130, the screws 176 fixing the second bracket 164 to the first bracket 150 are loosened, to permit rotation of the second bracket 164 relative to the first bracket 150. In this state, a suitable tool is engaged with the engaging recess 230 formed in the drive member 222 of the rotating mechanism 220, and the drive member 222 is rotated with the tool, about the axis or centerline of the shaft portion 224.

Since the drive portion 226 fitted in the arcuate elongate hole 228 of the second bracket 164 is eccentric with respect to the shaft portion 224, a rotary motion of the drive member 222 about the axis of the shaft portion 224 causes the drive portion 226 to press the second bracket 164, so that the second bracket 164 is rotated about the axis C1 of the component camera 130, relative to the first bracket 150, while the part-cylindrical convex surface 244 of the arcuate protrusion 240 of the second bracket 164 is guided by the part-cylindrical concave surface 250 of the arcuate groove 242 of the first bracket 150. As a result, the component camera 130 is rotated about its axis C1, so that the X-axis and Y-axis directions of the imaging area of the component camera 130 are made parallel to the third and second directions, respectively. After the adjustment, the screws 176 are tightened again to fix the second bracket 164 to the first bracket 150.

Since the part-cylindrical convex surface 244 of the arcuate protrusion 240 is held in pressing close contact with the part-cylindrical concave surface 250 of the arcuate groove 242 by the springs 260 of the ball plungers 260, the second bracket 164 can be rotated relative to the first bracket 150 while the part-cylindrical convex surface 244 is accurately guided by the part-cylindrical concave surface 250. Further, the inclination of the part-cylindrical concave contacting surface 248 relative to the part-cylindrical convex surface 244 causes a force to act on the arcuate protrusion 240 so as to be held within the arcuate groove 242, so that the second bracket 164 is rotated with high stability while the contacting surfaces 168, 170 are held in close contact with each other. In addition, a resistance of friction between the arcuate protrusion 240 and the arcuate groove 242 is relatively small in the presence of a gap between the part-cylindrical concave contacting surface 248 and the part-cylindrical convex surface 276, so that the arcuate protrusion 240 can be smoothly moved within the arcuate groove 242.

To adjust the position of the component camera 130 in the first direction, the screws 192 are loosened, and the operating screw 200 is rotated so that the third bracket 180 is lifted or lowered while the third bracket 180 is guided at its guide groove 184 by the guide rail 188. Thus, the position of the component camera 130 in the direction of its height or the direction of height of the prism device 280 or in the above-indicated Z-axis direction can be adjusted to adjust the focal point of the component camera 130. After the adjustment, the screws 192 are tightened again to fix the third bracket 180 to the second bracket 150.

As described above, the component camera 130, 132 is adjusted in the angular position as well as the positions in the first, second and third directions, to eliminate the positioning errors in the various directions, for establishing the predetermined XY coordinate system of the imaging area of the component camera 130, 132, thereby making it possible to avoid deterioration of accuracy of the image data which would take place due to the positioning errors.

Each of the arcuate protrusion 240 and the arcuate groove 242 of the angular position adjusting devices 140, 142 is formed as a part of an annular protrusion or groove concentric with a circle which has a center at the axis C1, C2 of the component camera 130, 132. That is, the arcuate protrusion 240 and the arcuate groove 242 have comparatively small circumferential lengths, so that the dimension of the angular position adjusting devices 140, 142 in the second direction (in which the axes C1, C2 are arranged) can be reduced. Further, the first, second and third brackets 150, 164, 180 and the rotating mechanism 220 of each angular position adjusting device 140, 142 are arranged in a straight row in the third direction, so that the dimension of each angular position adjusting device 140, 142 in the second direction is made smaller than where those elements are arranged in the second direction. Accordingly, the required distance between the axes C1, C2 of the two component cameras 130, 132 can be reduced, so that the component cameras 130, 132 can be installed in a relatively small space, so as to permit the adjustment of their angular positions.

Although the biasing device (260) is provided in the second member (144, 140) in the above embodiment, the biasing device may be provided in the first member, as in a second embodiment of this invention, which will be described by reference to FIGS. 7 and 8. The same reference signs as used in the first embodiment will be used in the second embodiment to identify the same elements, and most of which will not be described. It is also noted that some of the same elements not shown in FIGS. 7 and 8 will be described using the same reference signs as used in the first embodiment.

Figure 7:
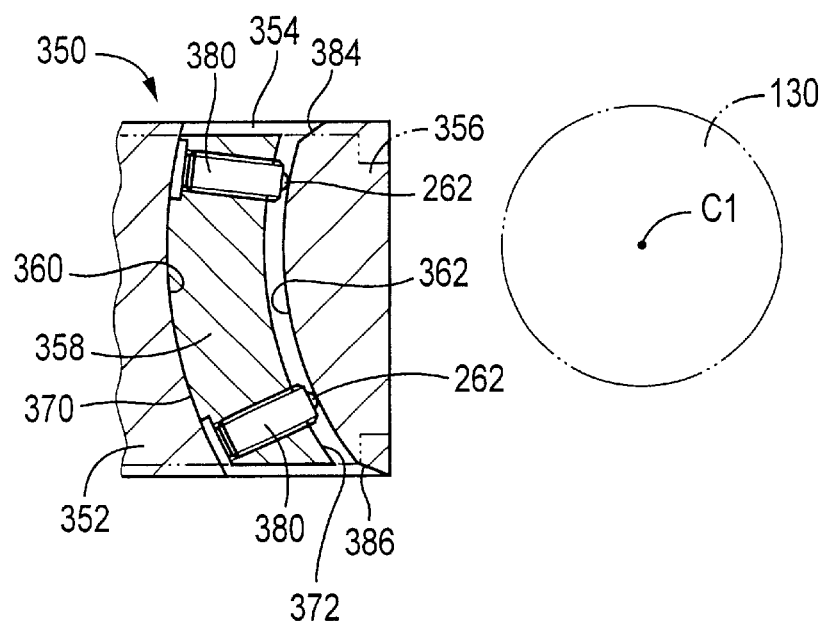
FIG. 7 is a plan view in cross section showing an arcuate protrusion, an arcuate groove and the ball plunger of an angular position adjusting device according to another embodiment of this invention.
Figure 8:
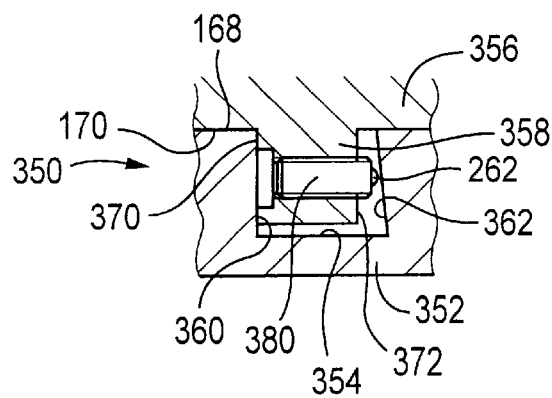
FIG. 8 is a side elevational view in cross section showing the arcuate protrusion, arcuate groove and ball plunger which are shown in FIG. 7.

The second embodiment uses an angular position adjusting device 350, which includes a first bracket 352 having an arcuate groove 354, and a second bracket 356 including an arcuate protrusion 358 fitted in the arcuate groove 354, as shown in FIG. 7. Like the arcuate groove 242, the arcuate groove 354 is formed along an arc of a circle having a center at the axis C1 of the component camera 130, such that the arcuate grove 354 has a substantially rectangular shape in vertical cross section. The arcuate surface of the arcuate groove 254 on the radially outer side of the above-indicated circle is a part-cylindrical concave surface 250 serving as a guiding surface, while the arcuate surface of the arcuate grove 254 on the radially inner side of the above-indicated circle is a part-cylindrical convex contacting surface 362. As shown in FIG. 8, the part-cylindrical convex contacting surface 362 is inclined such that the width of the arcuate groove 354 which is a distance between the concave and convex surfaces 360, 362 decreases in a direction from the bottom of the arcuate groove 354 toward the opening, that is, in the upward direction as seen in FIG. 8. Thus, the shape of the arcuate grove 354 in vertical cross section is substantially rectangular, with one of the four sides being slightly inclined.

The arcuate protrusion 358 is also formed along an arc of the above-indicated circle having the center at the axis C1, such that the arcuate protrusion 358 has a substantially rectangular shape in vertical cross section. The arcuate surface of the arcuate protrusion 358 on the radially outer side of the above-indicated surface is a part-cylindrical convex surface 370 serving as a guided surface for contact with the part-cylindrical concave surface 360 which serves as the guiding surface. The arcuate protrusion 358 has a width smaller than that of the arcuate groove 354, so that there is a gap between the part-cylindrical convex contacting surface 362 of the arcuate groove 354 and a part-cylindrical concave surface 372 of the arcuate protrusion 358 on the radially inner side of the above-indicated circle.

Two ball plungers 380 serving as a biasing device are screwed in respective tapped holes formed in the arcuate protrusion 358. Each ball plunger 380 is identical in construction with the ball plungers 260 described above. The ball plungers 380 are positioned relative to the arcuate protrusion 358, so as to extend in the radial direction of the component camera 130, and such that the ball 262 is opposed to the part-cylindrical convex contacting surface 362.

The ball plungers 380 are fixed to the arcuate protrusion 358 before the second bracket 356 is mounted on the first bracket 352. A distance of protrusion of each ball plunger 380 from the part-cylindrical concave surface 372 before the second bracket 356 is mounted on the first bracket 352 is determined such that the ball 262 is in contact with the part-cylindrical convex contacting surface 362 when the arcuate protrusion 358 is fitted in the arcuate groove 354, and such that the ball 262 is spaced apart from the inner annular edge of the opening of the casing 264, against the biasing force of the spring 266, so that the part-cylindrical convex surface 370 of the arcuate protrusion 358 is forced against the part-cylindrical concave surface 360 of the arcuate groove 354 by the biasing force, whereby these surfaces 370, 360 are held in pressing close contact with each other.

Before the second bracket 356 is mounted on the first bracket 352, a distance between the ball 262 and the part-cylindrical concave surface 372 is larger than a distance of the above-indicated gap between the surface 372 and the part-cylindrical convex contacting surface 362 when the arcuate protrusion 358 is fitted in the arcuate groove 354. To facilitate the fitting of the arcuate protrusion 358 into the arcuate groove 354, in the presence of the balls 262 projecting from the part-cylindrical concave surface 372, the opposite end portions of the part-cylindrical convex contacting surface 362 of the arcuate groove 354 of the first bracket 352 as seen in the direction of the arc of the groove 354 are slightly cut out to form respective guide surfaces 384, 386 which are inclined radially inwardly of the convex surface 362, as shown in FIG. 7.

When the second bracket 356 is mounted on the first bracket 352, the arcuate protrusion 358 is inserted into the arcuate groove 354 in one of the opposite directions along the arc of the arcuate groove 354, such that each ball 262 is moved toward the interior of the casing 264 against the biasing force of the spring 266, in sliding contact with the corresponding one of the guide surfaces 384, 386. Thus, the arcuate protrusion 358can be smoothly inserted into the arcuate groove 354. With the arcuate protrusion 358 thus inserted into the arcuate groove 354, the part-cylindrical convex surface 370 is forced against the part-cylindrical concave surface 360 by the biasing force of the springs 266, so that the surfaces 370, 360 are held in pressing close contact with each other. Accordingly, the second bracket 356 can be rotated relative to the first bracket 352 about the axis C1, with the surface 370 being guided by the surface 360 with high stability. The inclination of the part-cylindrical convex contacting surface 362 relative to the part-cylindrical concave surface 360 causes a force to act on the arcuate protrusion 358 so as to be held within the arcuate groove 354, so that the contacting surface 170 of the second bracket 354 is forced against the contacting surface 168 of the first bracket 352.

When the angular position of the component camera 130 is adjusted, the second bracket 356 is released from the first bracket 352, and a suitable rotating mechanism (not shown) similar to the rotating mechanism 220 is operated to rotate the second bracket 356 about the axis C1 of the component camera 130, while the part-cylindrical convex surface 370 is guided by the part-cylindrical concave surface 360, so that the component camera 130 is rotated about its axis C1. The second bracket 356 can be rotated with high stability, to accurately adjust the angular position of the component camera 130, owing to the close contact between the part-cylindrical convex and concave surfaces 370, 360 under the biasing action of the ball plungers 380, and the pressing close contact between the contacting surfaces 170, 168 caused by the inclination of the part-cylindrical convex contacting surface 362. The rotation of the second bracket 356 is further facilitated in the presence of the gap between the part-cylindrical concave surface 372 of the arcuate protrusion 358 and the part-cylindrical convex surface 362 of the arcuate groove 354.

While the illustrated embodiments are arranged such that the first member (164, 180) has the part-cylindrical convex surface (244, 370) while the second member (144, 150) has the part-cylindrical concave surface (250, 360), the second and first members may have the part-cylindrical concave and convex surfaces, respectively.

The first and second members may have an arcuate groove and an arcuate protrusion, respectively.

While the image-taking device (130, 132) provided in the illustrated embodiments is capable of taking both of a projection or silhouette image and a normal front image of the electronic component, the image-taking device may be arranged to take one of those images.

In the illustrated embodiments, the two component cameras 130, 132 are provided and selectively used depending upon the size of the electronic component 38. However, the provision of the two component cameras is not essential. For instance, only one component camera having a sufficiently wide field of view may be used. Alternatively, at least one component camera capable of adjusting its field of view (magnification ratio) may be used.

The component camera or cameras may be located on a path of the turning movement of each suction nozzle, such that each camera is opposed to the suction nozzle located at the component-hold-position detecting position.

The image-taking device is not limited to the one arranged to take a two-dimensional image at one time, but may use a line sensor which includes a multiplicity of imaging elements arranged in a straight row and which is moved relative to the object, to take successive line images which collectively define a two-dimensional image of the object.

In the illustrated embodiments, the reference jig used to establish the predetermined angular position of the nozzle holder 111 is rotated relative to the nozzle holder 111 upon adjustment of the angular position of the component cameras 130, 132. However, the nozzle holder 111 holding the reference jig may be rotated relative to the nozzle holding member 110, to establish the predetermined angular position.

The adjustment of the angular position of the component cameras 130, 132 may be effected when a predetermined condition is satisfied. For instance, the adjustment may be effected when a predetermined cumulative time of operations to mount the electronic components 38 on the printed-wiring boards 60 has passed, or when the electronic components 38 have been mounted on a predetermined number of the boards 60. Alternatively, the adjustment may be effected when a predetermined time has passed after the last adjustment.

The principle of the present invention is equally applicable to an angular position adjusting device for adjusting the angular position of an image-taking device in any system or device other than the electronic-component mounting system, and to a device for adjusting the angular position of any object other than the image-taking device, about an axis or centerline of the object.

It is to be understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. An electric-component mounting system comprising:

a substrate holding device operable to hold a circuit substrate;

a component supplying device operable to supply an electric component;

a component mounting device including a suction nozzle to hold the electric component by suction under a negative pressure, said component mounting device being operable to receive at said suction nozzle the electric component from said component supplying device, and to mount the electric component on said circuit substrate;

an image-taking device operable to obtain image data for obtaining relative positioning errors between said circuit substrate and said electric component as held by said suction nozzle, said relative positioning errors including a relative angular positioning error between said circuit substrate and said electric component as held by said suction nozzle;

a first member which holds said image-taking device;

a second member which holds said first member such that said first member is rotatable about an axis of said image-taking device; and a rotating mechanism associated with said first and second members, and operable to rotate said first member relative to said second member about said axis, and wherein said second member has an arcuate guiding surface formed to extend along an arc of a circle having a center at said axis of said image-taking device, said arc having a center angle smaller than 180°, and said first member has a guided surface for sliding contact with said arcuate guiding surface to guide a rotary movement of said first member by said rotating mechanism relative to said second member, for rotating said image-taking about said axis.

2. The electric-component mounting device according to claim 1, further comprising a biasing device associated with said first and second members and operable to bias said first and second members toward each other, for pressing contact of said guiding and guided surfaces with each other.

3. The electric-component mounting device according to claim 2, wherein said biasing device includes:

a ball;

a ball holder holding said ball such that said ball can roll and partly project from said ball holder but cannot be removed from said ball holder; and an elastic member interposed between said ball and said ball holder and biasing said ball in a direction for said ball to project from said ball holder, and wherein said ball holder is fixed to one of said first and second members, such that said ball is held in pressing contact with a part-cylindrical surface which is formed on the other of said first and second members, so as to extend along an arc of said circle having the center at said axis of rotation of said image-taking device.

4. The electric-component mounting device according to claim 2, wherein one of said first and second members has an arcuate groove having a substantially rectangular shape in cross section taken in a plane which is parallel to a radial direction of said image-taking device and which includes said axis of rotation of said image-taking device, and the other of said first and second members includes an arcuate protrusion received in said arcuate groove, and wherein one of opposite arcuate surfaces of said arcuate groove and one of opposite arcuate surfaces of said arcuate protrusion which is opposed to said one of said opposite arcuate surfaces of said arcuate groove are forced against each other with a biasing force of said biasing device and serve as one and the other of said guiding surface and said guided surface.

5. The electric-component mounting device according to claim 4, wherein said biasing device includes:

a ball;

a ball holder holding said ball such that said ball can roll and partly project from said ball holder but cannot be removed from said ball holder; and an elastic member interposed between said ball and said ball holder and biasing said ball in a direction for said ball to project from said ball holder, and wherein said ball holder is fixed to one of said arcuate protrusion and a portion of said one of said first and second members which portion has the other of said opposite arcuate surfaces of said arcuate groove, said ball holder being fixed so as to extend in a substantially radial direction of said arcuate protrusion and groove, and wherein said ball is held in pressing contact with one of the other of said opposite arcuate surfaces of said arcuate protrusion and said other of said opposite surfaces of said arcuate groove.

6. The electric-component mounting device according to claim 5, wherein said ball is held in pressing contact with the other of said opposite arcuate surfaces of said arcuate protrusion, and said other of said opposite arcuate surfaces of said arcuate protrusion is inclined such that a distance between said opposite arcuate surfaces of said arcuate protrusion decreases in a direction from a free end toward a fixed end of said arcuate protrusion.

7. The electric-component mounting device according to claim 5, wherein said ball is held in pressing contact with said other of said opposite arcuate surfaces of said arcuate groove, and said other of said opposite surface surfaces of said arcuate groove is inclined such that a distance between said opposite arcuate surfaces of said arcuate groove decreases in a direction from a bottom toward an opening of said arcuate groove.

8. The electric-component mounting system according to claim 2, wherein said biasing device includes two ball plungers disposed which are spaced apart from each other along said arc of said arcuate guiding surface of said second member and each of which includes a ball for pressing contact of said guided surfaces with each other.

9. The electric-component mounting device according to claim 1, wherein said guiding surface formed on said second member is a part-cylindrical concave surface while said guided surface formed on said first member is a part-cylindrical convex surface.

10. The electric-component mounting device according to claim 1, wherein said first and second members have respective contacting surfaces which are held in contact with each other in an axial direction of said image-taking device, for positioning said first and second members in said axial direction.

11. The electric-component mounting device according to claim 10, further comprising a tightening device operable to force said first and second members against each other in said axial direction for increasing a pressure of contact of said contacting surfaces.

12. The electric-component mounting system according to claim 1, wherein a plurality of sets of said image-taking device, said first and second members and said rotating mechanism are arranged such that the axes of the image-taking devices extend in parallel with each other in a plane and are spaced apart from each other at a predetermined spacing pitch in a direction parallel to said plane and perpendicular to said axes.

13. The electric-component mounting system according to claim 12, further comprising an optical guiding device including a light-receiving portion disposed so as to be in opposed relation with said suction nozzle, and a light-distributing portion arranged to distribute a light received by said light-receiving portion, to said plurality of image-taking devices.

14. The electric-component mounting system according to claim 1, further comprising at least one of (a) a first-direction position adjusting device operable to adjust a position of said image-taking device in a first direction parallel to an axial direction of said image-taking device, (b) a second-direction position adjusting device operable to adjust a position of said image-taking device in a second direction which is parallel to one of two mutually perpendicular directions which are perpendicular to said first direction; and (c) a third-direction position adjusting device operable to adjust a position of said image-taking device in a third direction which is parallel to the other of said two mutually perpendicular directions.

15. The electric-component mounting system according to claim 1, wherein said image-taking device is operable to take an image of said electric component as held by said suction nozzle.

16. The electric-component mounting system according to claim 15, further comprising a control device operable to obtain said angular positioning error between said circuit substrate and said electric component as held by said suction nozzle, on the basis of at least said image taken by said image-taking device.

17. The electric-component mounting system according to claim 16, wherein said control device is operable to further obtain horizontal positioning errors of said electric component as held by said suction nozzle, in a plane perpendicular to said axis of said image-taking device.

18. The electric-component mounting system according to claim 1, wherein said center angle of said arc of said arcuate guiding surface is about 55°.

* * * * *